United States Patent
Hirakata et al.

(10) Patent No.: US 9,647,043 B2
(45) Date of Patent: May 9, 2017

(54) DISPLAY PANEL AND ELECTRONIC DEVICE

(71) Applicant: SEMICONDUCTOR ENERGY LABORAORY CO., LTD., Atsugi-shi, Kanagawa-ken (JP)

(72) Inventors: Yoshiharu Hirakata, Kanagawa (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 15/228,167

(22) Filed: Aug. 4, 2016

(65) Prior Publication Data

US 2016/0343777 A1 Nov. 24, 2016

Related U.S. Application Data

(63) Continuation of application No. 14/537,045, filed on Nov. 10, 2014, now Pat. No. 9,430,180.

(30) Foreign Application Priority Data

Nov. 15, 2013 (JP) .................................. 2013-236966
Nov. 15, 2013 (JP) .................................. 2013-236969

(51) Int. Cl.
*H01J 1/62* (2006.01)
*H01L 27/32* (2006.01)
(Continued)

(52) U.S. Cl.
CPC .......... *H01L 27/323* (2013.01); *G06F 3/1446* (2013.01); *H01L 27/3262* (2013.01);
(Continued)

(58) Field of Classification Search
CPC ...................... H01L 25/0753; H01L 27/3244
(Continued)

(56) References Cited

U.S. PATENT DOCUMENTS 7,674,650 B2   3/2010   Akimoto et al.
8,063,400 B2   11/2011  Sugimoto
(Continued)

FOREIGN PATENT DOCUMENTS

CN   101739171 A   6/2010
CN   101996535 A   3/2011
(Continued)

OTHER PUBLICATIONS

International Search Report (Application No. PCT/IB2014/065944) Dated Mar. 17, 2015.
(Continued)

*Primary Examiner* — Vip Patel
(74) *Attorney, Agent, or Firm* — Nixon Peabody LLP; Jeffrey L. Costellia

(57) ABSTRACT

A display panel includes a flexible substrate, a first display region, a second display region, and a third display region. The first display region has a quadrangle outline and includes a first side and a second side forming a first corner portion of the outline. The second display region is in contact with the first side and the width of the second display region in a direction parallel to the first side coincides with the length of the first side. The third display region is in contact with the second side and the width of the third display region in a direction parallel to the second side coincides with the length of the second side. The substrate includes a notch portion corresponding a region facing the first display region with the first corner portion provided therebetween.

21 Claims, 21 Drawing Sheets

(51) Int. Cl.
   *G06F 3/14*    (2006.01)
   *H01L 51/00*   (2006.01)
   *G02F 1/1333*  (2006.01)

(52) U.S. Cl.
   CPC ...... *H01L 27/3276* (2013.01); *H01L 51/0097* (2013.01); *G02F 1/133305* (2013.01); *G09G 2300/02* (2013.01); *G09G 2380/02* (2013.01)

(58) Field of Classification Search
   USPC ........................................ 313/498, 506, 512
   See application file for complete search history.

(56)            References Cited

U.S. PATENT DOCUMENTS

| | | | |
|---|---|---|---|
| 8,415,208 | B2 | 4/2013 | Takayama et al. |
| 8,502,788 | B2 | 8/2013 | Cho |
| 8,516,728 | B2 | 8/2013 | Jung |
| 8,531,411 | B2 | 9/2013 | Kuwajima et al. |
| 8,593,061 | B2 | 11/2013 | Yamada |
| 8,610,118 | B2 | 12/2013 | Yamazaki et al. |
| 8,610,155 | B2 | 12/2013 | Hatano et al. |
| 8,736,162 | B2 | 5/2014 | Jin et al. |
| 9,122,088 | B2 | 9/2015 | Omote et al. |
| 2003/0201974 | A1 | 10/2003 | Yin |
| 2010/0065832 | A1 | 3/2010 | Sugimoto |
| 2010/0117975 | A1 | 5/2010 | Cho |
| 2010/0248403 | A1 | 9/2010 | Hatano et al. |
| 2010/0317409 | A1 | 12/2010 | Jiang et al. |
| 2011/0050657 | A1 | 3/2011 | Yamada |
| 2012/0081306 | A1 | 4/2012 | Sirpal et al. |
| 2013/0002133 | A1 | 1/2013 | Jin et al. |
| 2013/0002583 | A1 | 1/2013 | Jin et al. |
| 2013/0109438 | A1 | 5/2013 | Kwack et al. |
| 2013/0180882 | A1 | 7/2013 | Hamers et al. |
| 2013/0194761 | A1 | 8/2013 | Kim |
| 2013/0222208 | A1 | 8/2013 | Gorilovsky et al. |
| 2014/0063719 | A1* | 3/2014 | Yamazaki ............. G06F 1/1601 361/679.21 |
| 2014/0099999 | A1 | 4/2014 | Hatano et al. |
| 2014/0247405 | A1 | 9/2014 | Jin et al. |

FOREIGN PATENT DOCUMENTS

| | | |
|---|---|---|
| CN | 102855821 A | 1/2013 |
| CN | 102855822 A | 1/2013 |
| CN | 202816269 U | 3/2013 |
| CN | 202887620 U | 4/2013 |
| DE | 102012211232 | 1/2013 |
| EP | 2133854 A | 12/2009 |
| EP | 2192750 A | 6/2010 |
| EP | 2541371 A | 1/2013 |
| JP | 2002-014366 A | 1/2002 |
| JP | 2003-174153 A | 6/2003 |
| JP | 2003-345286 A | 12/2003 |
| JP | 2006-005712 A | 1/2006 |
| JP | 2006-349788 A | 12/2006 |
| JP | 2007-326259 A | 12/2007 |
| JP | 2010-153813 | 7/2010 |
| JP | 2011-047977 A | 3/2011 |
| JP | 2012-124812 A | 6/2012 |
| JP | 2013-015835 A | 1/2013 |
| JP | 2013-015836 A | 1/2013 |
| JP | 2013-097370 A | 5/2013 |
| JP | 2013-114658 A | 6/2013 |
| JP | 2013-539137 | 10/2013 |
| JP | 2013-545334 | 12/2013 |
| KR | 2010-0052227 A | 5/2010 |
| KR | 2013-0004085 A | 1/2013 |
| KR | 2013-0007311 A | 1/2013 |
| TW | 201306339 | 2/2013 |
| TW | 201311066 | 3/2013 |
| WO | WO-2008/123416 | 10/2008 |
| WO | WO-2008/126250 | 10/2008 |
| WO | WO-2012/044717 | 4/2012 |
| WO | WO-2012/132846 | 10/2012 |

OTHER PUBLICATIONS

Written Opinion (Application No. PCT/162014/065944) Dated Mar. 17, 2015.

Taiwanese Office Action (Application No. 105129135) Dated Dec. 20, 2016.

\* cited by examiner

FIG. 2A1
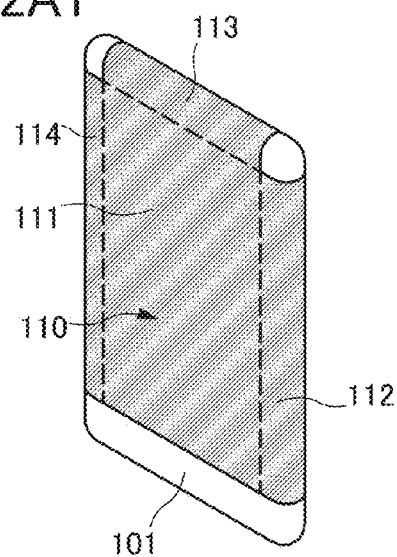
FIG. 2A2
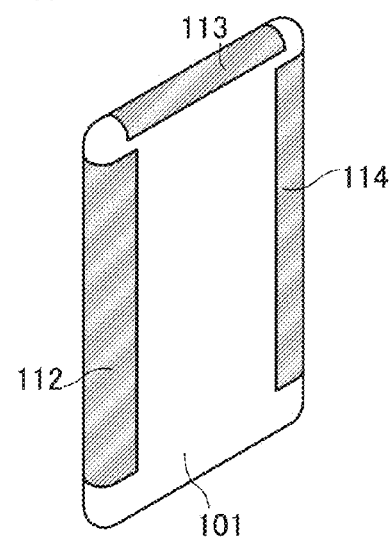
FIG. 2B1
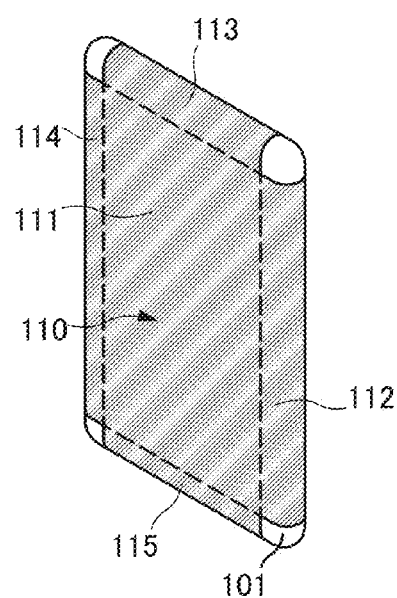
FIG. 2B2
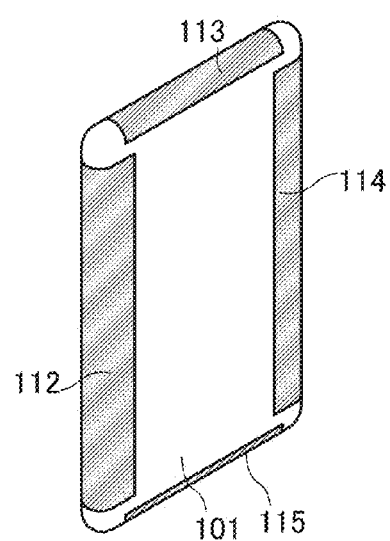

FIG. 3A1
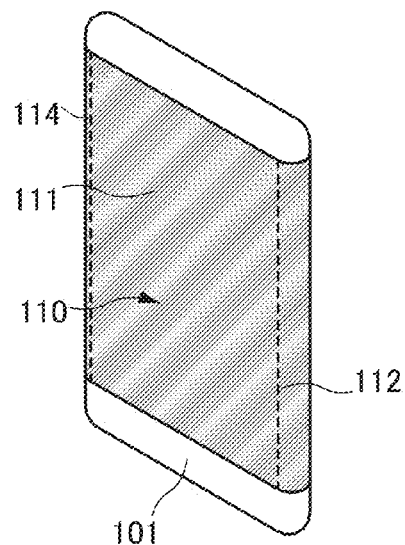
FIG. 3A2
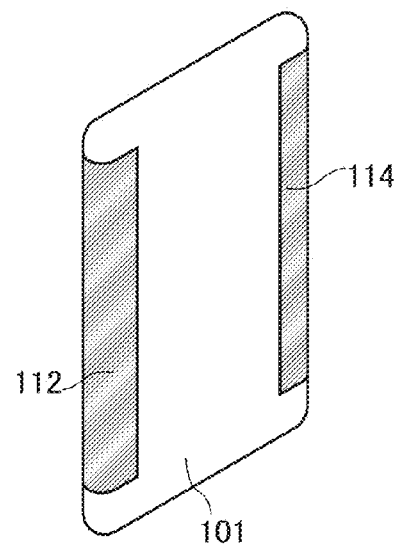
FIG. 3B1
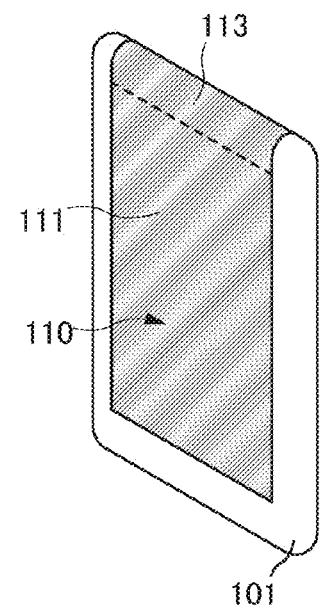
FIG. 3B2
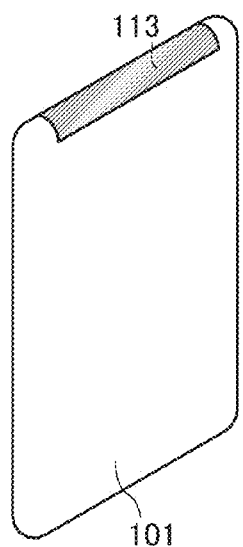

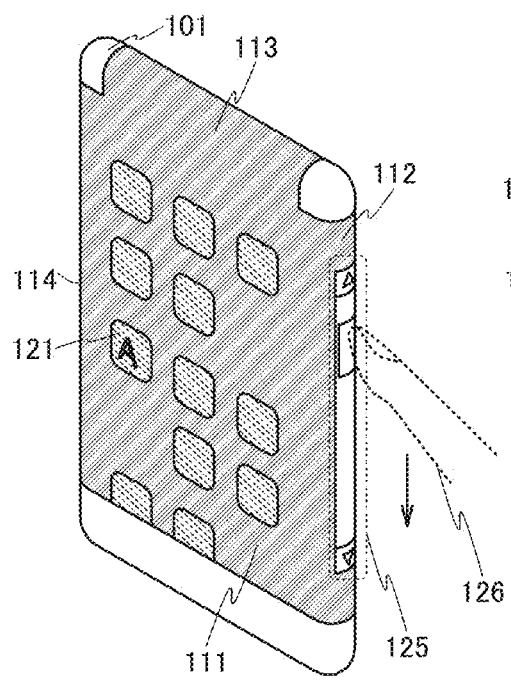
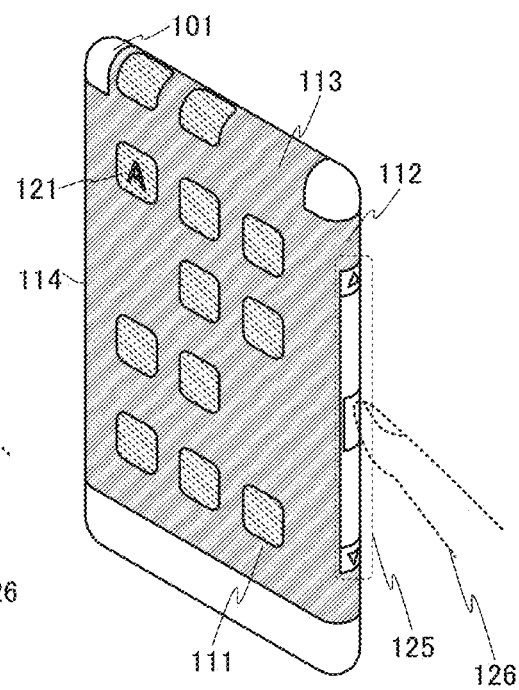

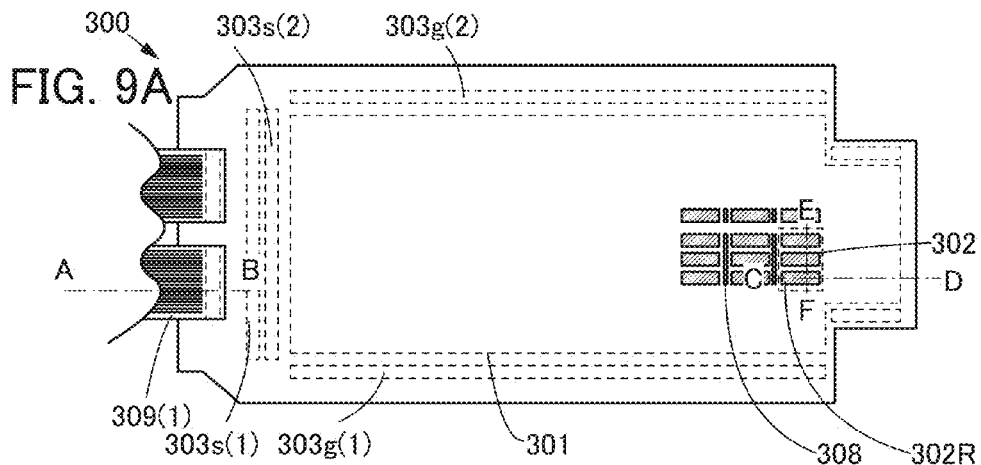
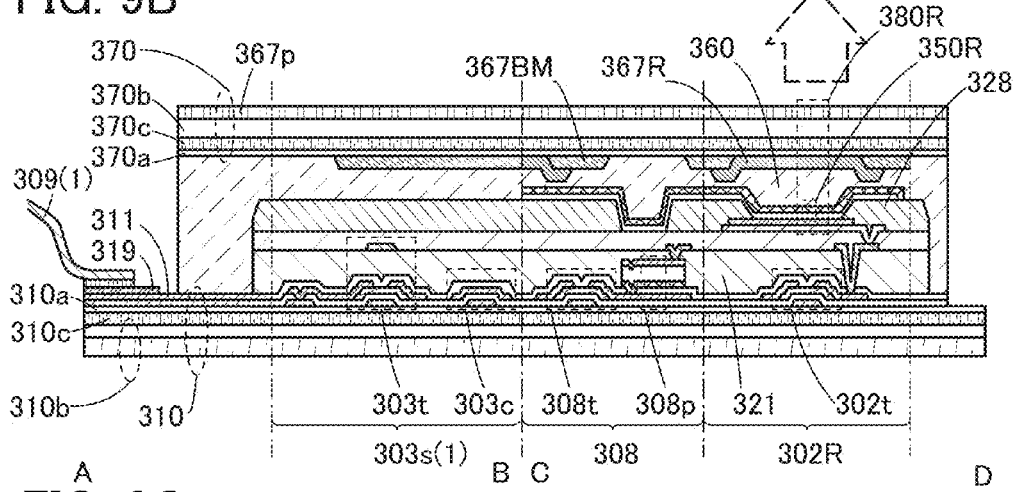
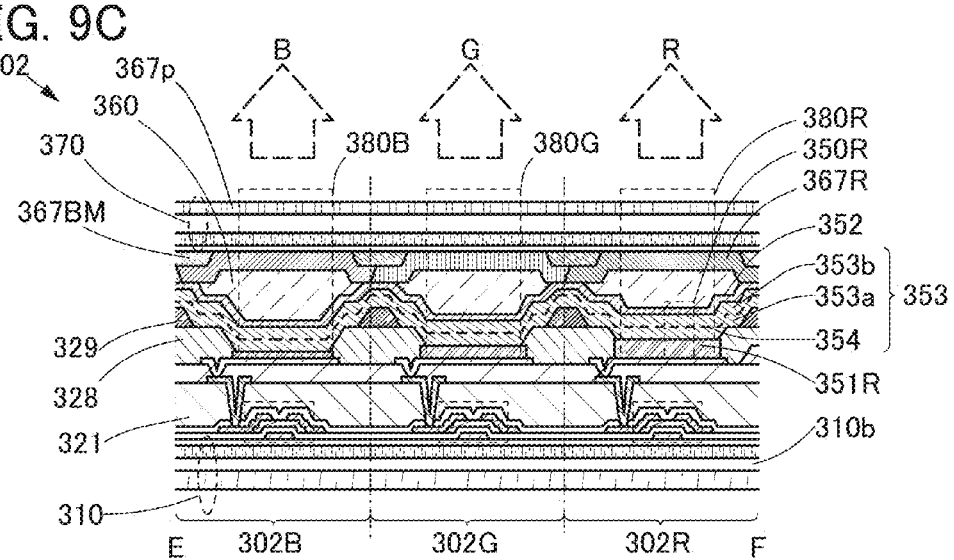

500B

FIG. 15A
FIG. 15B
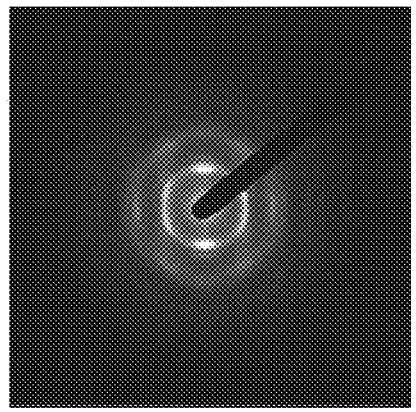
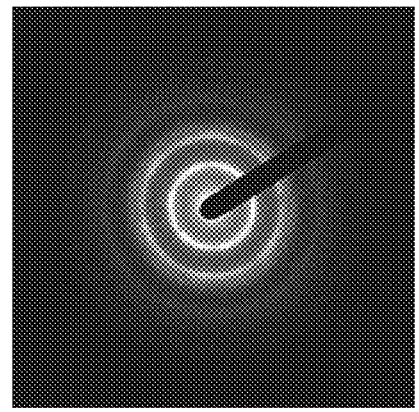

FIG. 19A1
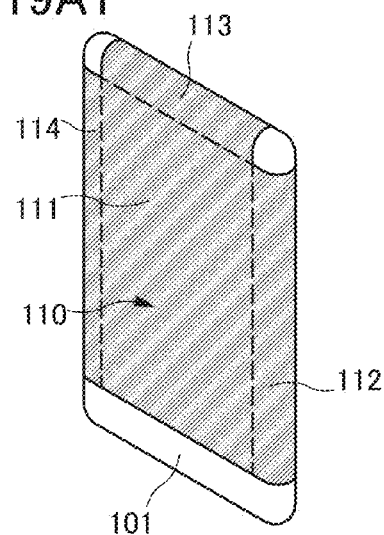
FIG. 19A2
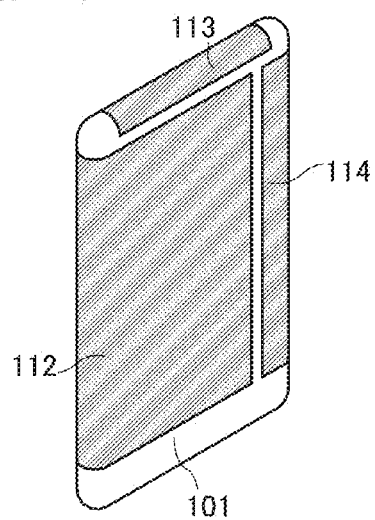
FIG. 19B1
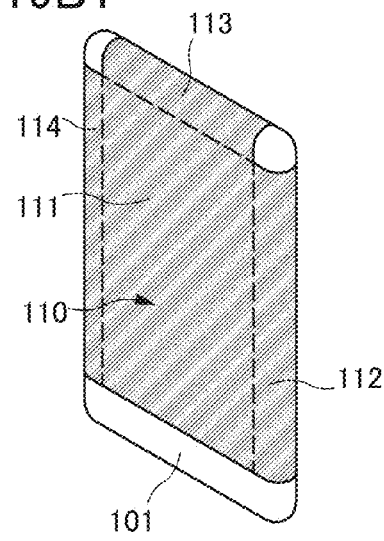
FIG. 19B2
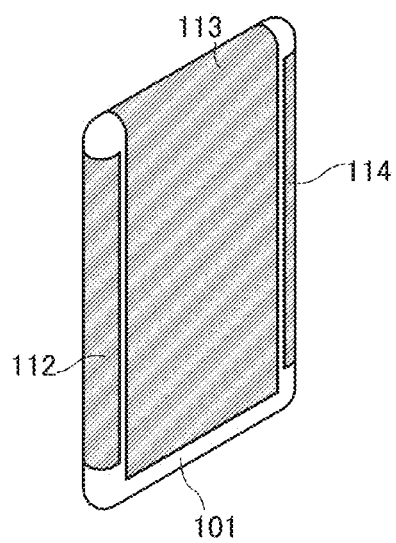

FIG. 20A1
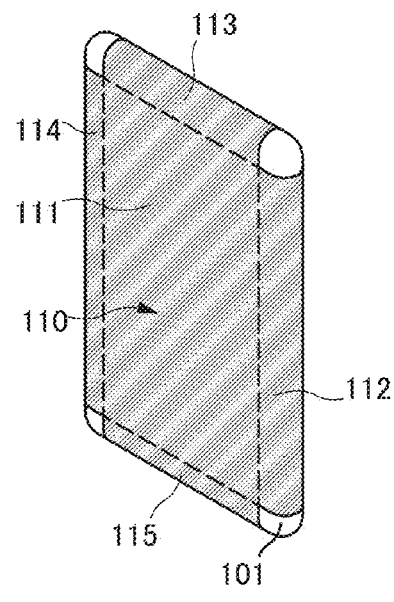
FIG. 20A2
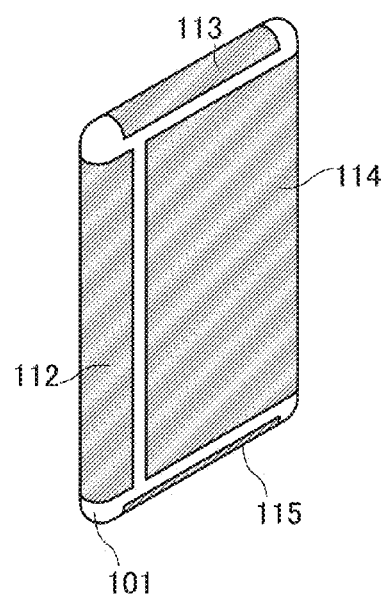
FIG. 20B1
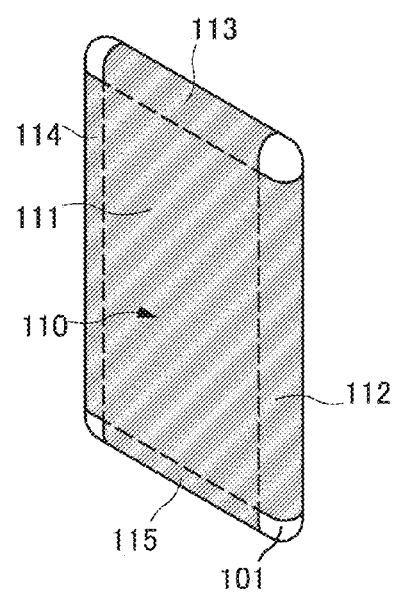
FIG. 20B2
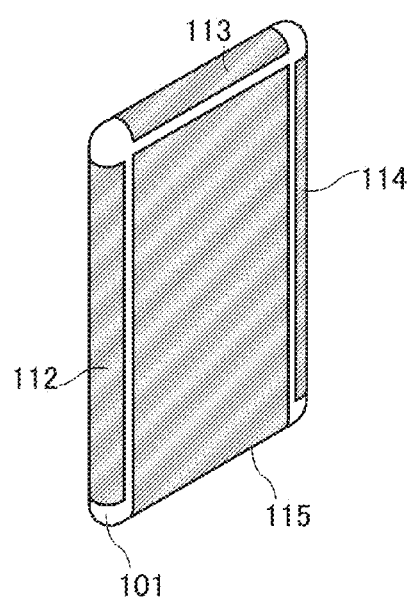

FIG. 21A1
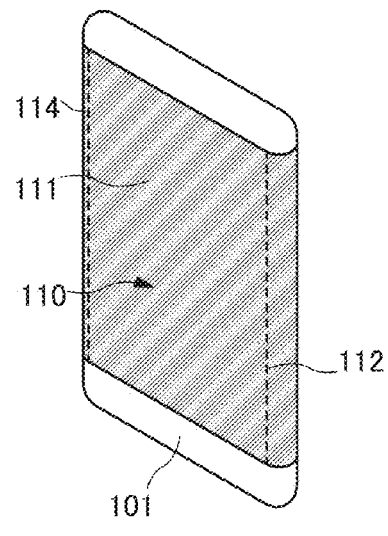
FIG. 21A2
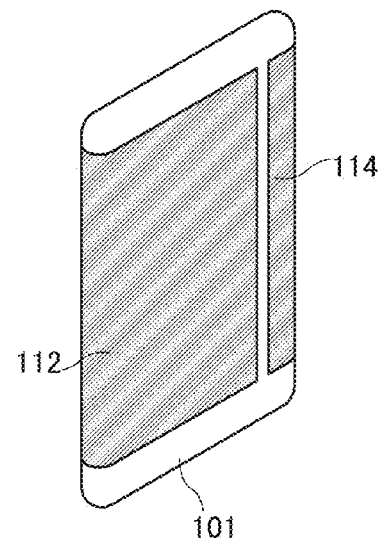
FIG. 21B1
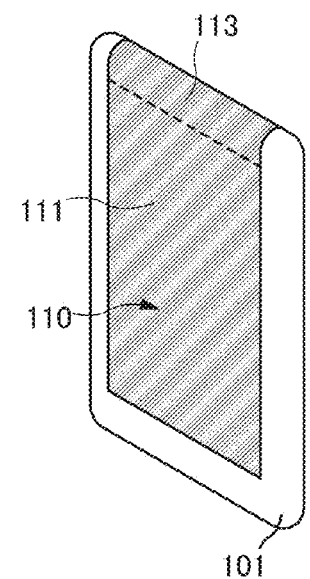
FIG. 21B2
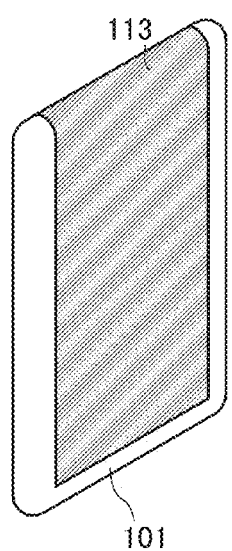

DISPLAY PANEL AND ELECTRONIC DEVICE

TECHNICAL FIELD

The present invention relates to an object, a method, or a manufacturing method. In addition, the present invention relates to a process, a machine, manufacture, or a composition of matter. In particular, one embodiment of the present invention relates to a light-emitting device, a display device, an electronic device, a lighting device, a driving method thereof, or a manufacturing method thereof. In particular, one embodiment of the present invention relates to a display panel (display device) capable of display on a curved surface. One embodiment of the present invention relates to an electronic device, a light-emitting device, or a lighting device that includes a display device capable of display on a curved surface, or a manufacturing method thereof.

BACKGROUND ART

Recent display devices are expected to be applied to a variety of uses and become diversified. For example, reduction in thickness, improvement in performance, and multi-functionalization of a portable information terminal such as a smartphone or a tablet terminal including a touch panel have progressed.

Patent Document 1 discloses a flexible active matrix light-emitting device in which an organic EL element and a transistor serving as a switching element are provided over a film substrate.

REFERENCE

Patent Document

[Patent Document 1] Japanese Published Patent Application No. 2003-174153

DISCLOSURE OF INVENTION

An object of one embodiment of the present invention is to provide a novel electronic device. Another object of one embodiment of the present invention is to provide an electronic device capable of a variety of display. Another object of one embodiment of the present invention is to provide an electronic device which can be operated in a variety of ways. Another object of one embodiment of the present invention is to provide a display device (display panel) which can be used for such an electronic device. Another object of one embodiment of the present invention is to provide a novel display device.

Note that the descriptions of these objects do not disturb the existence of other objects. Note that in one embodiment of the present invention, there is no need to achieve all the objects. Objects other than the above objects will be apparent from and can be derived from the description of the specification and the like.

One embodiment of the present invention is a display panel which includes a flexible substrate, a first display region, a second display region, and a third display region. The first display region has a quadrangle outline and includes a first side and a second side forming a first corner portion of the outline. The second display region is in contact with the first side and the width of the second display region in a direction parallel to the first side coincides with the length of the first side. The third display region is in contact with the second side and the width of the third display region in a direction parallel to the second side coincides with the length of the second side. The substrate has a notch portion in a region facing the first display region with the first corner portion provided therebetween.

It is preferable that the display panel include a plurality of pixels and the pixels each include a transistor including an oxide semiconductor in a semiconductor layer in which a channel is formed.

It is preferable that the display panel include a plurality of pixels and the pixels each include a transistor including polycrystalline silicon in a semiconductor layer in which a channel is formed.

It is preferable that the display panel further include a first driver circuit which outputs a signal to the first display region and the second display region and a second driver circuit which outputs a signal to the third display region. It is preferable that the first driver circuit be provided along a side of the second display region which is opposite to the first side, and the second driver circuit be provided along a side of the third display region in a direction in which the first side extends. The first driver circuit and the second driver circuit are preferably electrically connected to each other through a wiring.

Alternatively, It is preferable that the display panel further include a driver circuit which outputs a signal to the first display region, the second display region, and the third display region. It is preferable that the driver circuit be provided along a side of the second display region which is opposite to the first side and the driver circuit and the third display region be electrically connected to each other through a wiring.

A fourth display region in contact with a third side of the first display region which is opposite to the first side is preferably provided.

A fourth display region in contact with a third side of the first display region which is opposite to the first side and a fifth display region in contact with a fourth side of the first display region which is opposite to the second side are preferably provided.

Another embodiment of the present invention is an electronic device including any one of the above display panels and a housing. The housing has a top surface, a rear surface, a first side surface, a second side surface in contact with the first side surface, a third side surface opposite to the first side surface, and a fourth side surface opposite to the second side surface. Each of the first side surface and the second side surface preferably has a curved surface continuous from the top surface to the rear surface. It is preferable that the first display region of the display panel be provided along the top surface, the second display region thereof be provided along the first side surface, and the third display region thereof be provided along the second side surface.

Another embodiment of the present invention is an electronic device including the above display panel and a housing. The housing has a top surface, a rear surface, a first side surface, a second side surface in contact with the first side surface, a third side surface opposite to the first side surface, and a fourth side surface opposite to the second side surface. Each of the first side surface, the second side surface, and the third side surface preferably has a curved surface continuous from the top surface to the rear surface. It is preferable that the first display region of the display panel be provided along the top surface, the second display region thereof be provided along the first side surface, the third display region thereof be provided along the second side surface, and the fourth display region thereof be provided along the third side surface.

Another embodiment of the present invention is an electronic device including the above display panel and a housing. The housing has a top surface, a rear surface, a first side surface, a second side surface in contact with the first side surface, a third side surface opposite to the first side surface, and a fourth side surface opposite to the second side surface. Each of the first side surface, the second side surface, the third side surface, and the fourth side surface preferably has a curved surface continuous from the top surface to the rear surface. It is preferable that the first display region of the display panel be provided along the top surface, the second display region thereof be provided along the first side surface, the third display region thereof be provided along the second side surface, the fourth display region thereof be provided along the third side surface, and the fifth display region thereof be provided along the fourth side surface.

Any one of the above electronic devices is preferably further provided with a touch sensor at a position overlapping with the display panel, and the touch sensor is preferably provided along the top surface and at least one of the first side surface, the second side surface, the third side surface, and the fourth side surface of the housing.

Note that in this specification, the display device might include any of the following modules in its category: a module in which a connector such as a flexible printed circuit (FPC) or a tape carrier package (TCP) is attached to a display panel (display device); a module having a TCP provided with a printed wiring board at the end thereof; and a module having an integrated circuit (IC) directly mounted by a chip on glass (COG) method over a substrate over which a display element is formed.

According to one embodiment of the present invention, a novel electronic device can be provided. Alternatively, an electronic device capable of a variety of display can be provided. Alternatively, an electronic device which can be operated in a variety of ways can be provided. Alternatively, a display device which can be used for such an electronic device can be provided. Alternatively, a novel display device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

In the accompanying drawings:

FIGS. 2A1, 2A2, 2B1, and 2B2 illustrate structure examples of an electronic device of an embodiment;

FIGS. 3A1, 3A2, 3B1, and 3B2 illustrate structure examples of an electronic device of an embodiment;

FIGS. 5A and 5B illustrate a structure example of an electronic device of an embodiment;

FIGS. 9A to 9C illustrate a structure example of a display panel of an embodiment;

FIGS. 15A and 15B show electron diffraction patterns of a CAAC-OS;

FIGS. 19A1, 19A2, 19B1, and 19B2 illustrate structure examples of an electronic device of an embodiment;

FIGS. 20A1, 20A2, 20B1, and 20B2 illustrate structure examples of an electronic device of an embodiment; and FIGS. 21A1, 21A2, 21B1, and 21B2 illustrate structure examples of an electronic device of an embodiment.

BEST MODE FOR CARRYING OUT THE INVENTION

Figure 1A:
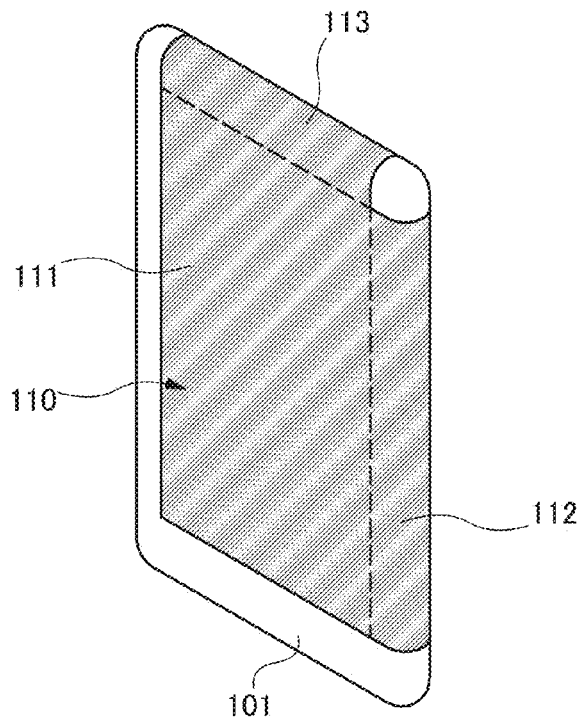
FIGS. 1A and 1B illustrate a structure example of an electronic device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not necessarily limited to such a scale.

Note that in this specification and the like, ordinal numbers such as "first", "second", and the like are used in order to avoid confusion among components and do not limit the number.

Embodiment 1

In this embodiment, an electronic device of one embodiment of the present invention and a display panel (also referred to as a display device) which can be used in the electronic device are described with reference to drawings.

[Examples of Electronic Device]

Figure 1B:
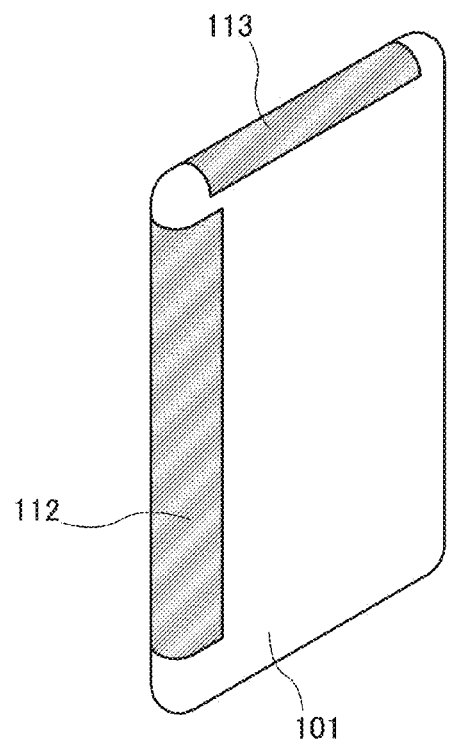

FIG. 1A is a schematic perspective view illustrating the top surface side of an electronic device described below, and FIG. 1B is a schematic perspective view illustrating the rear surface side thereof.

The electronic device illustrated in FIGS. 1A and 1B includes a housing 101 and a display panel 110 which is provided on a surface of the housing 101.

The housing 101 has a top surface, a rear surface, a first side surface, a second side surface in contact with the first side surface, a third side surface opposite to the first side surface, and a fourth side surface opposite to the second side surface.

The display panel 110 includes a first display region 111 overlapping with the top surface of the housing 101, a second display region 112 overlapping with one of the side surfaces of the housing 101, and a third display region 113 overlapping with another one of the side surfaces of the housing 101. Here, suppose that the first side surface of the housing 101 overlaps with the second display region 112 and the second side surface of the housing 101 overlaps with the third display region 113.

Among the four side surfaces of the housing 101, at least a region overlapping with the display panel 110 preferably has a curved surface. For example, it is preferable that there be no corner portion between the top surface and the side surface and between the side surface and the rear surface, and that these surfaces are continuous. Furthermore, the side surface is preferably a curved surface such that the inclination of a tangent line is continuous from the top surface to the rear surface of the housing 101. In particular, the side surface preferably has a developable surface that is obtained by transforming a flat surface without expansion and contraction.

Figure 17A:
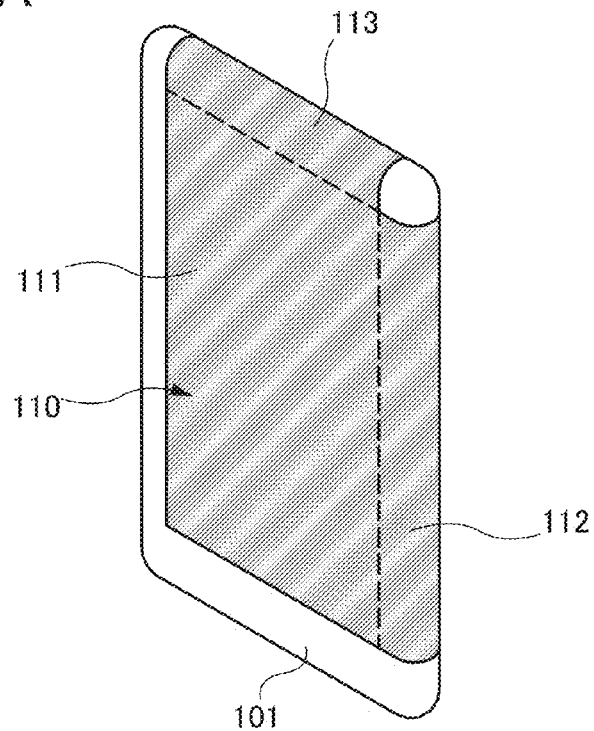
FIGS. 17A and 17B illustrate a structure example of an electronic device of an embodiment.
Figure 17B:
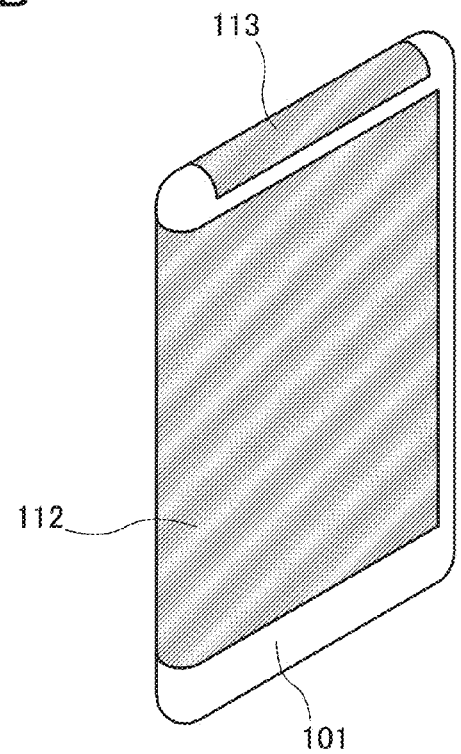
Figure 18A:
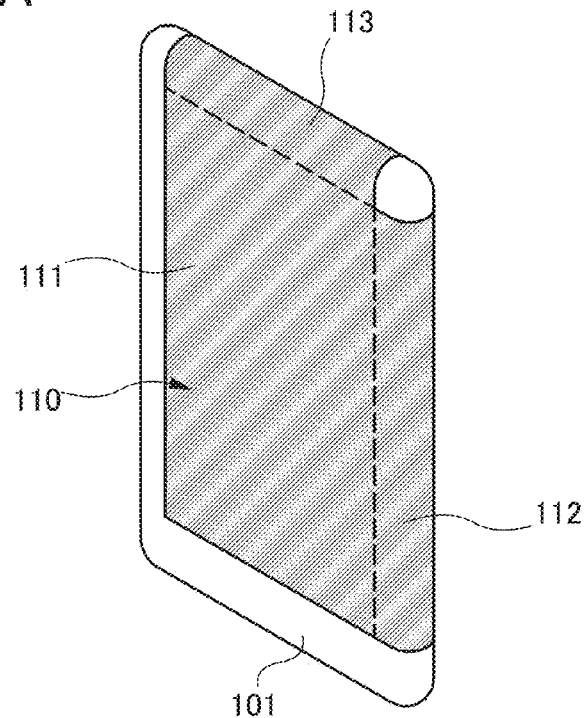
FIGS. 18A and 18B illustrate a structure example of an electronic device of an embodiment.
Figure 18B:
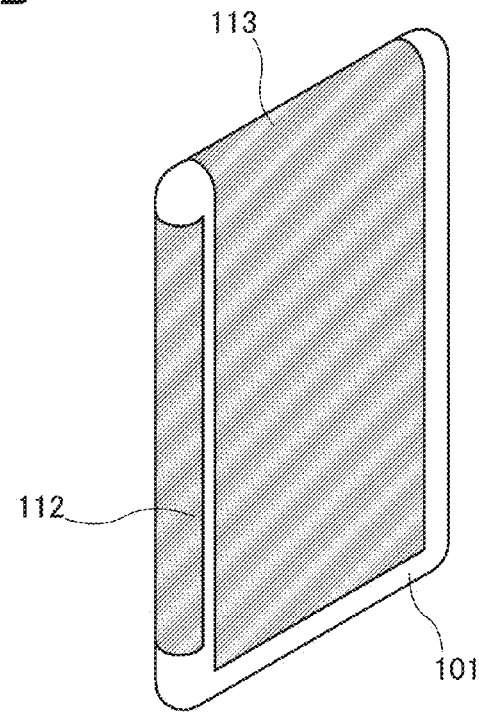

As illustrated in FIGS. 1A and 1B, the second display region 112 is provided along the first side surface of the housing 101 and may extend to the rear surface of the housing 101. The third display region 113 is provided along the second side surface of the housing 101 and may extend to the rear surface of the housing 101. Alternatively, a structure illustrated in FIGS. 17A and 17B may be employed. FIG. 17A is a schematic perspective view illustrating the top surface side of an electronic device, and FIG. 17B is a schematic perspective view illustrating the rear surface side thereof. Alternatively, a structure illustrated in FIGS. 18A and 18B may be employed. FIG. 18A is a schematic perspective view illustrating the top surface side of an electronic device, and FIG. 18B is a schematic perspective view illustrating the rear surface side thereof.

In addition to the display panel 110, a hardware button, an external connection terminal, or the like may be provided on the surface of the housing 101.

Although FIGS. 1A and 1B show the case where the two side surfaces of the housing 101 are used as the display region, the display region may overlap with another side surface.

FIGS. 2A1 and 2A2 illustrate a structure where a fourth display region 114 overlaps with the third side surface of the housing 101 which is opposite to the first side surface. FIGS. 2B1 and 2B2 illustrate a structure where a fifth display region 115 overlapping with the fourth side surface of the housing 101 which is opposite to the second side surface is provided in addition to this. Alternatively, a structure illustrated in FIGS. 19A1 and 19A2 may be employed. FIG. 19A1 is a schematic perspective view illustrating the top surface side of an electronic device, and FIG. 19A2 is a schematic perspective view illustrating the rear surface side thereof. Alternatively, a structure illustrated in FIGS. 19B1 and 19B2 may be employed. FIG. 19B1 is a schematic perspective view illustrating the top surface side of an electronic device, and FIG. 19B2 is a schematic perspective view illustrating the rear surface side thereof. Alternatively, a structure illustrated in FIGS. 20A1 and 20A2 may be employed. FIG. 20A1 is a schematic perspective view illustrating the top surface side of an electronic device, and FIG. 20A2 is a schematic perspective view illustrating the rear surface side thereof. Alternatively, a structure illustrated in FIGS. 20B1 and 20B2 may be employed. FIG. 20B1 is a schematic perspective view illustrating the top surface side of an electronic device, and FIG. 20B2 is a schematic perspective view illustrating the rear surface side thereof.

FIGS. 3A1 and 3A2 illustrate a structure where the second display region 112 overlapping with the first side surface of the housing 101 and the fourth display region 114 overlapping with the third side surface of the housing 101 which is opposite to the first side surface are provided. FIGS. 3B1 and 3B2 illustrate a structure where only the third display region 113 overlapping with the second side surface of the housing 101 is provided. Alternatively, a structure illustrated in FIGS. 21A1 and 21A2 may be employed. FIG. 21A1 is a schematic perspective view illustrating the top surface side of an electronic device, and FIG. 21A2 is a schematic perspective view illustrating the rear surface side thereof. Alternatively, a structure illustrated in FIGS. 21B1 and 21B2 may be employed. FIG. 21B1 is a schematic perspective view illustrating the top surface side of an electronic device, and FIG. 21B2 is a schematic perspective view illustrating the rear surface side thereof.

With such a structure, display can be performed not only on a surface parallel to the top surface of a housing, as in conventional electronic devices, but also on a surface parallel to a side surface of the housing. In particular, a display region is preferably provided along two or more side surfaces of the housing because the variety of display is further increased.

The first display region 111 provided along the top surface of the housing 101 and the display regions provided along the side surfaces of the housing 101 may be independently used as display regions to display different images and the like, or two or more of the display regions may display one image or the like. For example, a continuous image may be displayed on the first display region 111 provided along the top surface of the housing 101, the second display region 112 provided along the side surface of the housing 101, or the like.

Figure 4:
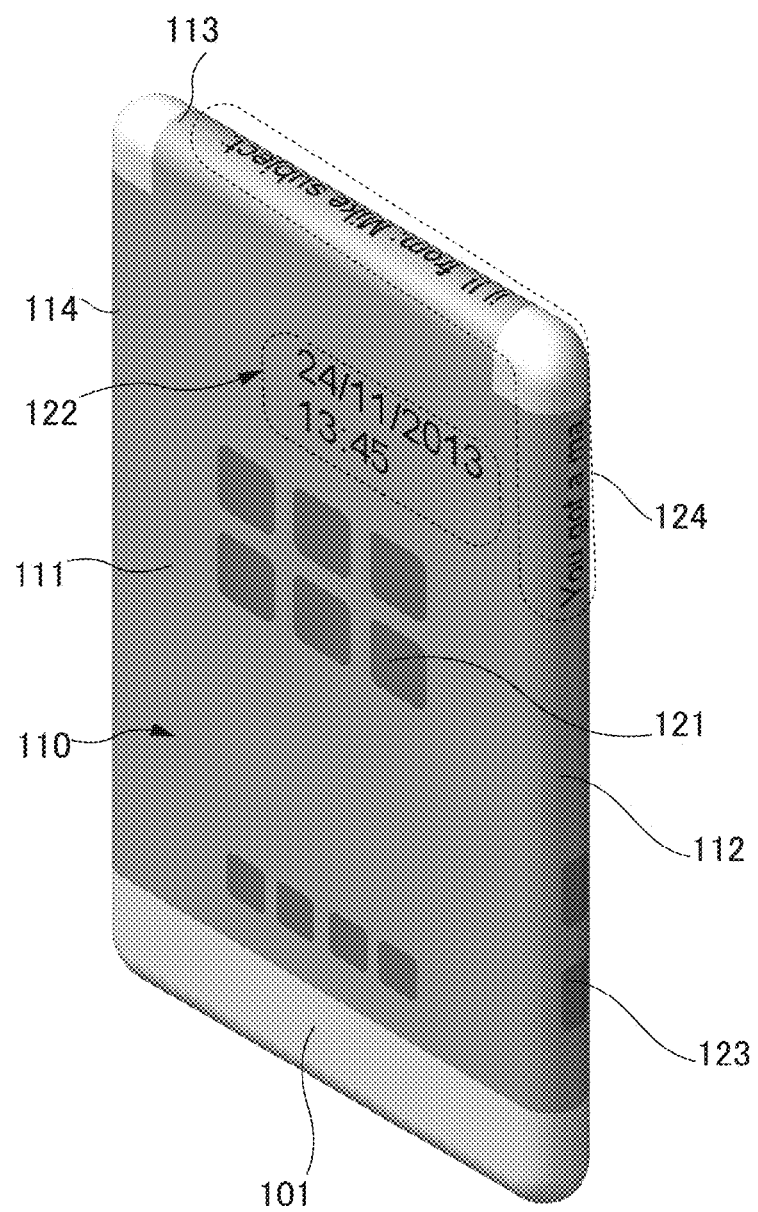
FIG. 4 illustrates a structure example of an electronic device of an embodiment.

FIG. 4 shows an example of a use state of the electronic device illustrated in FIGS. 2A1 and 2A2. In FIG. 4, text data 122, a plurality of icons 121 associated with an application or the like, and the like are displayed on the first display region 111 provided along the top surface of the housing 101. Icons 123 associated with an application or the like, and the like are displayed on the second display region 112 provided along the first side surface of the housing 101.

Furthermore, as illustrated in FIG. 4, display can be performed so that text data 124 or the like rolls (moves) across a plurality of display regions (here, the third display region 113 and the second display region 112) provided along the side surfaces of the housing 101. By performing display across two or more surfaces of the housing in this manner, a user can be prevented from missing displayed data regardless of the direction of the electronic device when, for example, a phone call is received.

In addition, transmitter information (e.g., a name, a phone number, an e-mail address, and the like of a transmitter) may be displayed on not only the first display region 111 but also a display region provided along the side surface such as the second display region 112 when, for example, a phone call or an e-mail is received. FIG. 4 shows an example of the case where transmitter information is displayed to roll across the second display region 112 and the third display region 113 when an e-mail is received.

FIGS. 5A and 5B show an example of a use state of an electronic device different from the above. In FIG. 5A, the plurality of icons 121 are displayed on the first display region 111 and a slide bar 125 is displayed on the second display region 112. By touching the slide bar 125 with a finger 126 or the like to move the slide bar up or down, display contents such as the icons 121 displayed on the first display region 111 are slid up or down accordingly as illustrated in FIG. 5B. FIGS. 5A and 5B illustrate a state where images of the plurality of icons 121 and the like are slid up from the first display region 111 to the third display region 113 by sliding the slide bar 125 down with the finger 126.

Although the case where an image displayed on the first display region 111 is an icon is shown here, one embodiment of the present invention is not limited thereto; depending on a launched application, a variety of data such as text, still images, and moving images can be displayed and slid. The position of the slide bar 125 is not limited to the second display region 112, and the slide bar 125 may be provided on the first display region 111, the third display region 113, the fourth display region 114, or the like.

During a standby time during which the electronic device is not used, display on the first display region 111 provided along the top surface of the housing 101 may be turned off (e.g., black display) and data may be displayed only on the second display region 112 or the like provided along the side surface. Display on the first display region 111 having an area larger than those of the other display regions is not performed, so that power consumption in a standby time can be reduced.

It is preferable that a touch sensor be provided at a position overlapping with the display panel 110, specifically, in regions overlapping with the display regions. As the touch sensor, a sheet-like capacitive touch sensor may be provided to overlap with the display panel 110. Alternatively, a so-called in-cell touch panel that has a touch sensor function may be provided as the display panel 110 itself. For the in-cell touch panel, a capacitive touch sensor may be used or an optical touch sensor using a photoelectric conversion element may be used.

For example, in the structure illustrated in FIG. 4, combination of touch operations on the first display region 111, the second display region 112, the third display region 113, and the fourth display region 114 is preferably associated with an application operation.

An example of association between combination of touch operations on the second display region 112, the third display region 113, and the fourth display region 114 and an application operation is shown in the following table. For example, a power on/off operation is performed when all the three display regions are touched. When the second display region 112 and the fourth display region 114 are touched at the same time, an application associated with an e-mail is started and contents of the e-mail are displayed at the same time. When the second display region 112 and the third display region 113 are touched at the same time, an application for making a phone call is started. When the third display region 113 and the fourth display region 114 are touched at the same time, a browser is started.

TABLE 1

| Second display region | Touch operation Third display region | Fourth display region | Operation |
| --- | --- | --- | --- |
| touched | touched | touched | power on/off |
| touched | not touched | touched | open e-mail |
| touched | touched | not touched | make phone call |
| not touched | touched | touched | start browser |

The above association between the touch operation and the application is an example, and it is preferable that a developer of operating system or application software or a user can determine an association as appropriate.

Alternatively, application operations are performed by touching one or more of the second to fourth display regions in a state where the first display region 111 is touched, in which case an unintended operation can be less likely to be started.

By associating combination of touch operations on a plurality of regions with application operations as described above, an intuitive operation is possible; thus, a user-friendly human interface can be obtained.

An electronic device of one embodiment of the present invention can perform display along not only the top surface but also two or more side surfaces of the housing; thus, display can be performed in various ways as compared with a conventional electronic device. Furthermore, a touch sensor is provided in each of the display regions; thus, various operations can be performed as compared with a conventional electronic device and an electronic device capable of a more intuitive operation can be obtained.

Note that an example of the case where a variety of display is performed using the display panel 110 is shown here; however, one embodiment of the present invention is not limited thereto. For example, depending on circumstances or conditions, data is not necessarily displayed. As an example, the electronic device may be used as a lighting device, not the display panel 110. By using the device as a lighting device, it can be used as interior lighting having an attractive design. Alternatively, it can be used as lighting with which various directions can be illuminated. Further alternatively, it may be used as a light source, e.g., a backlight or a front light, not the display panel 110. In other words, it may be used as a lighting device for the display panel.

[Structure Example of Display Panel]

Next, a structure example of a display panel which can be used for the electronic device of one embodiment of the present invention is described with reference to drawings.

Figure 6A:
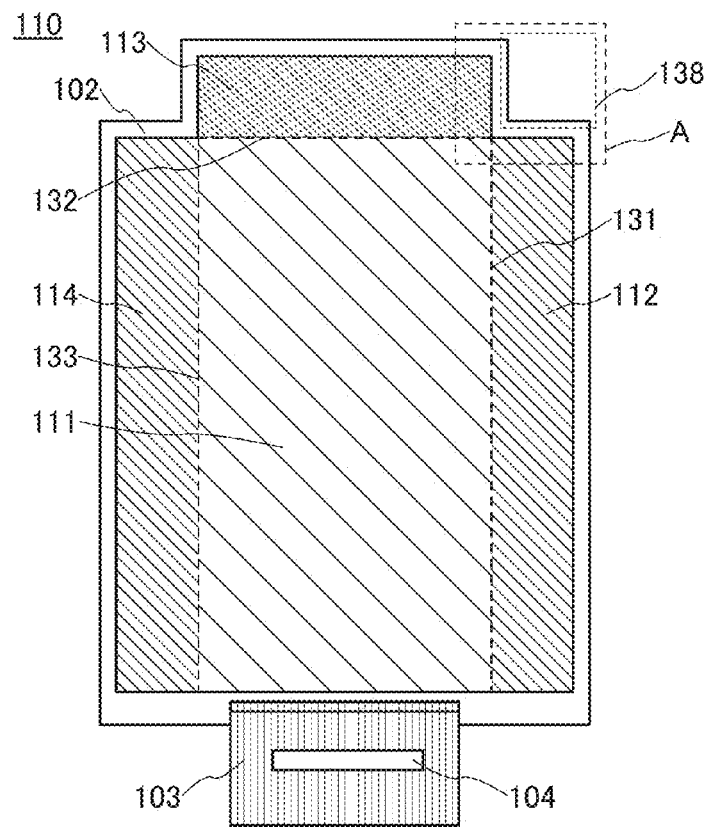
FIGS. 6A to 6C illustrate structure examples of a display panel of an embodiment.

FIG. 6A is a schematic top view of the display panel 110 described below. The display panel 110 includes a flexible substrate 102 and a plurality of pixels over the substrate 102. The display panel 110 includes the first display region 111, the second display region 112, the third display region 113, and the fourth display region 114. Note that different hatching patterns of display regions are used here for clarification.

The outline of the first display region 111 is a quadrangle. The second display region 112 is provided in contact with one (a first side 131) of four sides forming the outline of the first display region 111. The width of the first display region 111 preferably coincides with that of the second display region 112 in a direction parallel to the first side 131. The third display region 113 is provided in contact with a second side 132 which is in contact with the first side 131. The width of the first display region 111 preferably coincides with that of the third display region 113 in a direction parallel to the second side 132. Furthermore, a corner portion (first corner portion) formed by the first side 131 and the second side 132 preferably meets one of corner portions of the second display region 112 and one of corner portions of the third display region 113.

As illustrated in FIG. 6A, the substrate 102 includes a notch portion 138 in a region facing the first display region 111 with the first corner portion formed by the first side 131 and the second side 132 provided therebetween. Owing to the notch portion 138, the second display region 112 and the third display region 113 can be bent in different directions.

FIG. 6A illustrates a structure in which the fourth display region 114 is provided in contact with a third side 133 opposite to the first side 131. One of corner portions of the fourth display region 114 preferably meets a second corner portion formed by the second side 132 and the third side 133. The substrate 102 includes a notch portion similar to the notch portion 138 in a region facing the first display region 111 with the second corner portion provided therebetween. With such a structure, the fourth display region 114 and the third display region 113 can be bent in different directions.

Part of the substrate 102 is provided with an FPC 103 which supplies a signal and electric power for driving the pixels. Although FIG. 6A illustrates a structure in which an IC 104 is mounted on the FPC 103 by a COF method, the IC 104 is not necessarily provided. The IC 104 may be directly mounted on the substrate 102 by a COF method. Here, the width of the FPC 103 is preferably smaller than that of the first display region 111. Thus, particularly in the case where the second display region 112 and the fourth display region 114 are bent and the first display region 111 is flat, a junction portion of the FPC 103 and the substrate 102 is not bent and therefore, the FPC 103 can be prevented from being peeled.

Figure 6B:
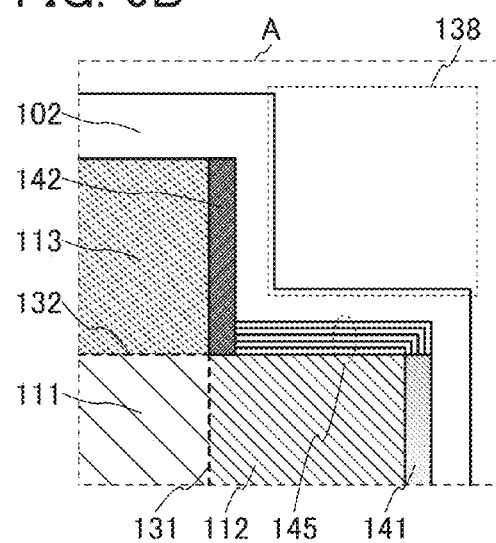

FIG. 6B is a schematic top view in which a region A in FIG. 6A is enlarged.

In FIG. 6B, a first driver circuit 141 which outputs a signal for driving pixels included in the first display region 111 and the second display region 112 to the first display region 111 and the second display region 112 and a second driver circuit 142 which outputs a signal for driving pixels included in the third display region 113 to the third display region 113 are provided. The first driver circuit 141 is provided along a side of the second display region 112 which is opposite to the first side 131. The second driver circuit 142 is provided along a side of the third display region 113 which is a side in a direction in which the first side 131 extends. The first driver circuit 141 and the second driver circuit 142 are electrically connected to each other through a wiring 145, and a signal input from the FPC 103 can be supplied to the second driver circuit 142 through the wiring 145.

Figure 6C:
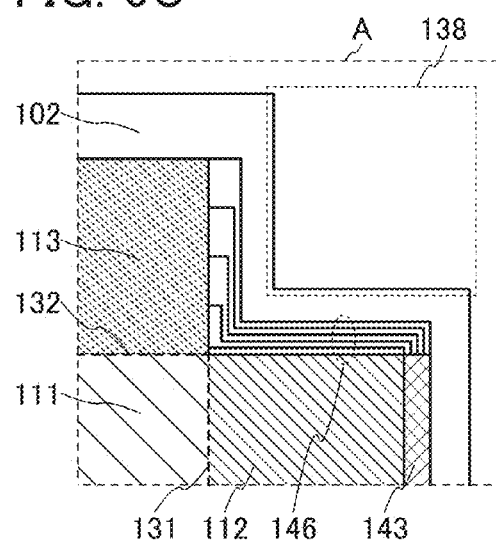

FIG. 6C illustrates a structure different from that in FIG. 6B. In FIG. 6C, a driver circuit 143 is provided instead of the first driver circuit 141. The driver circuit 143 can output a signal for driving pixels included in the first display region 111 and the second display region 112 and a signal for driving pixels included in the third display region 113. The signals output from the driver circuit 143 can be output to wirings electrically connected to the pixels in the third display region 113, through wirings 146.

As each of the first driver circuit 141, the second driver circuit 142, and the driver circuit 143, for example, a circuit serving as a gate driver circuit or a source driver circuit can be used; preferably, a gate driver circuit is used. In this case, the IC 104 preferably has a function as a source driver circuit.

Although a so-called driver integrated type display panel including a driver circuit over the substrate 102 is described here, a driver circuit is not necessarily provided over the substrate 102.

As described above, the second driver circuit 142 which outputs a signal for driving the pixels included in the third display region 113 or the wirings 146 which supplies a signal for driving the pixels is provided along the side of the third display region 113; thus, the area of the notch portion 138 can be increased and the area of a non-display portion with respect to a surface area of the display panel 110 can be reduced. In the case where the third display region 113 is bent as illustrated in FIGS. 5A and 5B, a structure in which a driver circuit is not provided in a bent portion as illustrated in FIG. 6C is preferable. Since electrical characteristics of a semiconductor element such as a transistor in a driver circuit might be changed owing to stress caused by bending, instability of an output signal from the driver circuit can be prevented with such a structure.

Figure 7A:
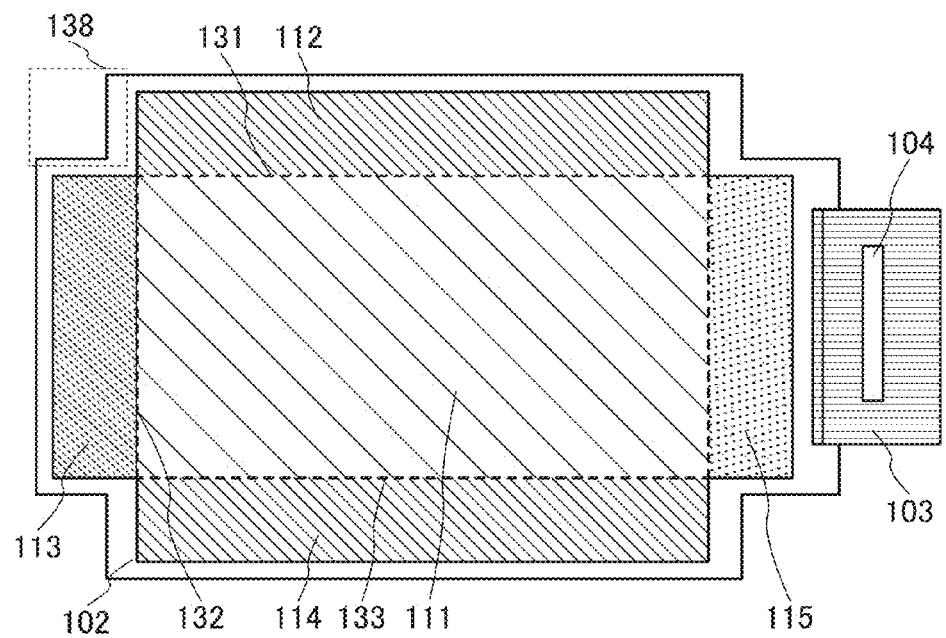
FIGS. 7A and 7B illustrate structure examples of a display panel of an embodiment.

Although FIGS. 6A to 6C illustrate the structure in which the first to fourth display regions are provided, first to third display regions may be provided or the fifth display region 115 may be additionally provided. FIG. 7A is a schematic top view showing the case where the fifth display region 115 is provided. A wiring between the fifth display region 115 and the second display region 112 and a driver circuit may have structures similar to those in FIG. 6B or FIG. 6C.

Figure 7B:
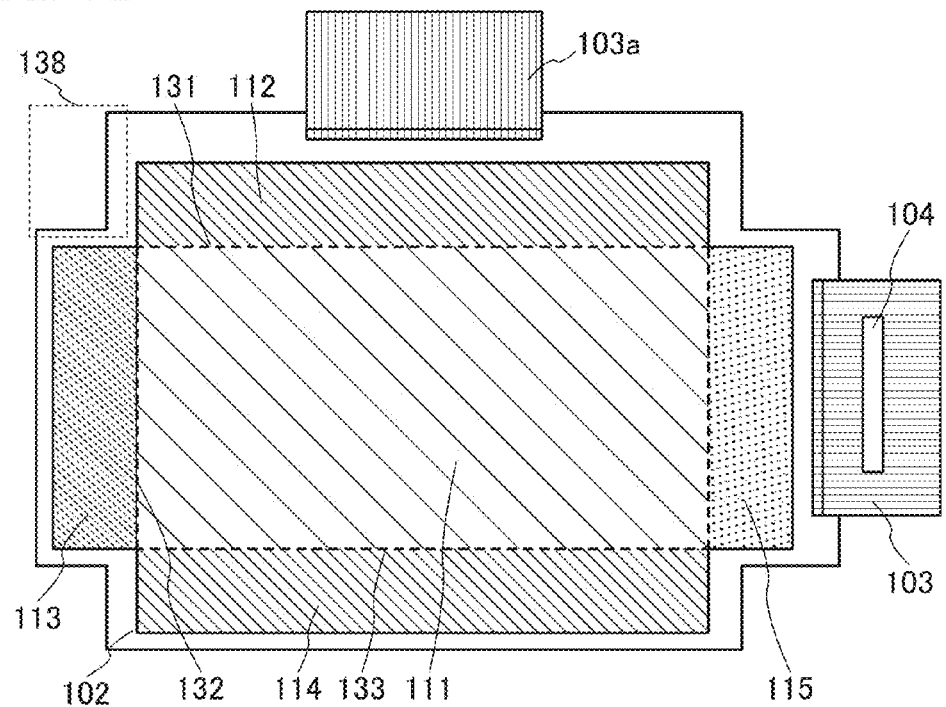

Furthermore, FIG. 7B illustrates an example of a structure where an FPC 103a is provided. The FPC 103a has a function of supplying a signal and electric power to, for example, the driver circuits described above. In the case where the display panel 110 does not include a driver circuit, an IC may be mounted on the FPC 103a by a COF method or the like.

Here, an oxide semiconductor is preferably used for semiconductor devices such as transistors used for pixels included in display regions or driver circuits in the display panel 110. In particular, an oxide semiconductor having a wider band gap than silicon is preferably used. A semiconductor material having a wider band gap and a lower carrier density than silicon is preferably used because off-state current of the transistor can be reduced.

The oxide semiconductor preferably contains at least indium (In) or zinc (Zn), for example. More preferably, the oxide semiconductor contains an oxide represented by an In-M-Zn-based oxide (M is a metal such as Al, Ti, Ga, Ge, Y, Zr, Sn, La, Ce, or Hf).

As the semiconductor layer, it is preferable to use an oxide semiconductor film including a plurality of crystal parts whose c-axes are aligned perpendicular to a surface on which the oxide semiconductor film is formed or the top surface of the oxide semiconductor film and in which the adjacent crystal parts have no grain boundary.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display panel which is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, a driver circuit can be stopped while a gray scale of an image displayed on each display region is maintained. As a result, an electronic device with an extremely low power consumption can be obtained.

Note that details of a preferable mode and a formation method of an oxide semiconductor that can be used for the semiconductor layer are described in an embodiment below.

Alternatively, a polycrystalline semiconductor may be used for semiconductor devices such as transistors used for pixels included in display regions or driver circuits in the display panel 110. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

Figure 8A:
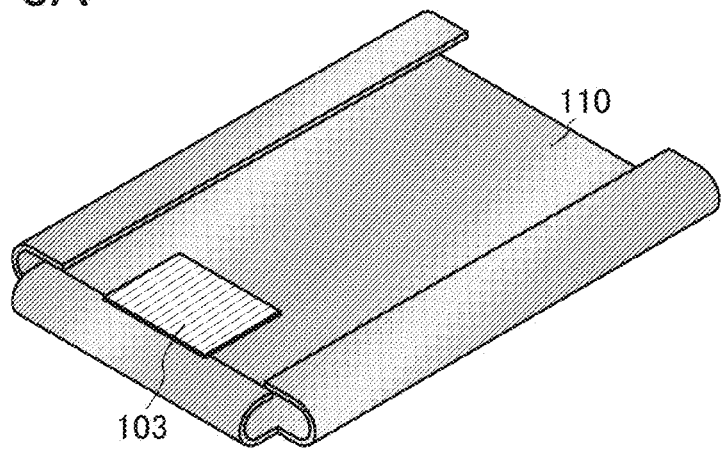
FIGS. 8A to 8C illustrate a structure example of a display panel and a touch sensor of an embodiment.
Figure 8B:
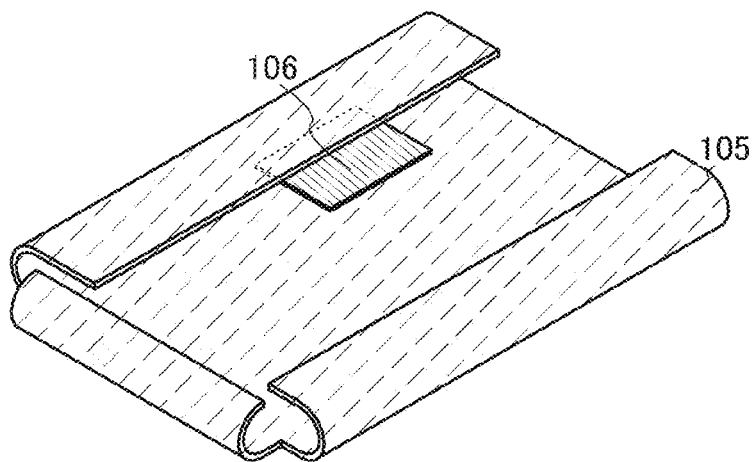
Figure 8C:
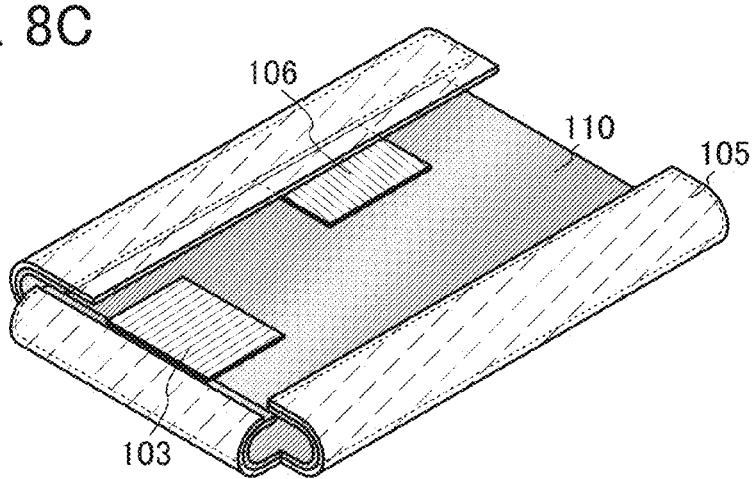

Here, FIGS. 8A to 8C illustrate an example where a sheet-like touch sensor is provided to overlap with the display panel 110.

FIG. 8A illustrates a state where part of the display panel 110 provided with the FPC 103 is bent. FIG. 8B illustrates a state where a sheet-like touch sensor 105 is bent in accordance with a curved surface of the display panel 110. The touch sensor 105 is provided with an FPC 106.

FIG. 8C illustrates a state where the display panel 110 and the touch sensor 105 are overlapped with each other. Here, as illustrated in FIG. 8C, it is preferable that the FPC 103 provided for the display panel 110 and the FPC 106 provided for the touch sensor 105 not overlap with each other. Therefore, the display panel 110 and the touch sensor 105 preferably do not have the same shape, and in a region to which the FPC 103 or the FPC 106 is attached, the display panel 110 and the touch sensor 105 preferably have different shapes so as not to overlap with each other.

As described above, the display panel 110 and the sheet-like touch sensor 105 are overlapped with each other and incorporated in the housing 101; thus, a touch function can be added to not only the top surface but also part of a side surface and the rear surface of the housing.

At least part of this embodiment can be implemented in combination with any of the other embodiments described in this specification as appropriate.

Embodiment 2

In this embodiment, a structure of a touch panel that can be used in an electronic device of one embodiment of the present invention will be described with reference to FIGS. 9A to 9C.

FIG. 9A is a top view illustrating a structure of a touch panel that can be used in an electronic device of one embodiment of the present invention.

FIG. 9B is a cross-sectional view taken along line A-B and line C-D in FIG. 9A.

FIG. 9C is a cross-sectional view taken along line E-F in FIG. 9A.

<Top View>

A touch panel 300 described as an example in this embodiment includes a display portion 301 (see FIG. 9A).

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the touch panel 300 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signals include a signal for selecting an imaging pixel circuit from which a recorded imaging signal is read, a signal for initializing an imaging pixel circuit, and a signal for determining the time it takes for an imaging pixel circuit to detect light.

The touch panel 300 is provided with an imaging pixel driver circuit 303g(2) that can supply control signals to the imaging pixels 308 and an imaging signal line driver circuit 303s(2) that reads out imaging signals.

<Cross-Sectional View>

The touch panel 300 includes a substrate 310 and a counter substrate 370 that faces the substrate 310 (see FIG. 9B).

The substrate 310 is a stacked body in which a flexible substrate 310b, a barrier film 310a that prevents diffusion of unintentional impurities to the light-emitting elements, and an adhesive layer 310c that attaches the barrier film 310a to the substrate 310b are stacked.

The counter substrate 370 is a stacked body including a flexible substrate 370b, a barrier film 370a that prevents diffusion of unintentional impurities to the light-emitting elements, and an adhesive layer 370c that attaches the barrier film 370a to the substrate 370b (see FIG. 9B).

A sealant 360 attaches the counter substrate 370 to the substrate 310. The sealant 360 also serving as an optical adhesive layer has a refractive index higher than that of air. The pixel circuits and the light-emitting elements (e.g., a light-emitting element 350R) are provided between the substrate 310 and the counter substrate 370.

<<Structure of Pixel>>

Each of the pixels 302 includes the sub-pixel 302R, a sub-pixel 302G, and a sub-pixel 302B (see FIG. 9C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit that can supply electric power to the light-emitting element 350R and includes a transistor 302t (see FIG. 9B). Furthermore, the light-emitting module 380R includes the light-emitting element 350R and an optical element (e.g., a coloring layer 367R).

The light-emitting element 350R includes a lower electrode 351R, an upper electrode 352, and a layer 353 containing a light-emitting organic compound between the lower electrode 351R and the upper electrode 352 (see FIG. 9C).

The layer 353 containing a light-emitting organic compound includes a light-emitting unit 353a, a light-emitting unit 353b, and an intermediate layer 354 between the light-emitting units 353a and 353b.

The light-emitting module 380R includes the coloring layer 367R on the counter substrate 370. The coloring layer transmits light of a particular wavelength and is, for example, a layer that selectively transmits light of red, green, or blue color. Note that a region that transmits light emitted from the light-emitting element as it is may be provided as well.

The light-emitting module 380R, for example, includes the sealant 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the sealant 360 that also serves as an optical adhesive layer and through the coloring layer 367R and is emitted to the outside of the light-emitting module 380R as indicated by arrows in FIGS. 9B and 9C.

Note that although the case where the light-emitting element is used as a display element is described here, one embodiment of the present invention is not limited thereto.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Examples of display devices having EL elements include an EL display. Examples of a display device including an electron emitter include a field emission display (FED), and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like.

<<Structure of Touch Panel>>

The touch panel 300 includes a light-blocking layer 367BM on the counter substrate 370. The light-blocking layer 367BM is provided so as to surround the coloring layer (e.g., the coloring layer 367R).

The touch panel 300 includes an anti-reflective layer 367p positioned in a region overlapping with the display portion 301. As the anti-reflective layer 367p, a circular polarizing plate can be used, for example.

The touch panel 300 includes an insulating film 321. The insulating film 321 covers the transistor 302t. Note that the insulating film 321 can be used as a layer for planarizing unevenness caused by the pixel circuits. An insulating film on which a layer that can prevent diffusion of impurities to the transistor 302t and the like is stacked can be used as the insulating film 321.

The touch panel 300 includes the light-emitting elements (e.g., the light-emitting element 350R) over the insulating film 321.

The touch panel 300 includes, over the insulating film 321, a partition 328 that overlaps with an end portion of the lower electrode 351R (see FIG. 9C). In addition, a spacer 329 that controls the distance between the substrate 310 and the counter substrate 370 is provided on the partition 328.

<<Structure of Image Signal Line Driver Circuit>>

The image signal line driver circuit 303s(1) includes a transistor 303t and a capacitor 303c. Note that the driver circuit can be formed in the same process and over the same substrate as those of the pixel circuits. As illustrated in FIG. 9B, the transistor 303t may include a second gate over the insulating film 321. The second gate may be electrically connected to a gate of the transistor 303t, or different potentials may be supplied thereto. The second gate may be provided in a transistor 308t described below, the transistor 302t, or the like if necessary.

<<Structure of Imaging Pixel>>

The imaging pixels 308 each include a photoelectric conversion element 308p and an imaging pixel circuit for sensing light received by the photoelectric conversion element 308p. The imaging pixel circuit includes the transistor 308t.

For example, a PIN photodiode can be used as the photoelectric conversion element 308p.

<<Other Structures>>

The touch panel 300 includes a wiring 311 through which a signal can be supplied. The wiring 311 is provided with a terminal 319. Note that an FPC 309(1) through which a signal such as an image signal or a synchronization signal can be supplied is electrically connected to the terminal 319.

Note that a printed wiring board (PWB) may be attached to the FPC 309(1).

Transistors formed in the same process can be used as the transistor 302t, the transistor 303t, the transistor 308t, and the like.

Transistors of a bottom-gate type, a top-gate type, or the like can be used.

As a gate, source, and drain of a transistor, and a wiring or an electrode included in a touch panel, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

The above-described oxide semiconductor is preferably used as a semiconductor in which a channel of a transistor such as the transistor 302t, the transistor 303t, or the transistor 308t is formed. Details of a preferable mode of the oxide semiconductor are described in an embodiment below.

Alternatively, silicon may be used as a semiconductor in which a channel of a transistor such as the transistor 302t, the transistor 303t, or the transistor 308t is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are included at extremely high definition, a gate driver circuit and a source driver circuit can be formed over a substrate over which the pixels are formed, the number of components included in an electronic device can be reduced.

Here, a method for forming a flexible display panel is described.

Here, a structure including a pixel and a driver circuit or a structure including an optical member such as a color filter is referred to as an element layer for convenience. An element layer includes a display element, for example, and may include a wiring electrically connected to a display element or an element such as a transistor used in a pixel or a circuit in addition to the display element.

Here, a support provided with an insulating surface over which an element layer is formed is called a base material.

As a method for forming an element layer over a base material provided with an insulating surface having flexibility, there are a method in which an element layer is formed directly over a base material, and a method in which an element layer is formed over a supporting base material having stiffness unlike a base material, and then the element layer is separated from the supporting base material and transferred to the base material.

In the case where a material of the base material can withstand heating temperature in the process for forming the element layer, it is preferable that the element layer be formed directly over the base material, in which case a manufacturing process can be simplified. At this time, the element layer is preferably formed in a state where the base material is fixed to the supporting base material, in which case transfer of the element layer in a device and between devices can be easy.

In the case of employing the method in which the element layer is formed over the supporting base material and then transferred to the base material, first, a separation layer and an insulating layer are stacked over a supporting base material, and then the element layer is formed over the insulating layer. Then, the element layer is separated from the supporting base material and then transferred to the base material. At this time, a material is selected so that separation at an interface between the supporting base material and the separation layer, at an interface between the separation layer and the insulating layer, or in the separation layer occurs.

For example, it is preferable that a stacked layer of a layer including high-melting-point metal material, such as tungsten, and a layer including an oxide of the metal material be used as the separation layer, and a stacked layer of a plurality of layers, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in of thermal expansion coefficient.

The peeling layer is not necessarily provided in the case where peeling can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and peeling may be performed at an interface between the glass and the insulating layer. Alternatively, a metal layer may be provided between the supporting base material and the insulating layer formed of an organic resin, and separation may be performed at the interface between the metal layer and the insulating layer by heating the metal layer by feeding a current to the metal layer. In that case, the insulating layer formed of an organic resin can be used as a base material.

Examples of such a base material having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low, for example, lower than or equal to $30 \times 10^{-6}$/K is preferable, and a polyamide imide resin, a polyimide resin, or PET can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Note that for a display device of one embodiment of the present invention, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, a metal insulator metal (MIM), a thin film diode (TFD), or the like can also be used. Since such an element has a small number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. When an active element (a non-linear element) is not used, the number of manufacturing steps is small, so that manufacturing cost can be reduced or the yield can be improved. Alternatively, when an active element (a non-linear element) is not used, the aperture ratio can be improved, so that power consumption can be reduced or higher luminance can be achieved, for example.

At least part of this embodiment can be implemented in combination with any of the other embodiments described in this specification as appropriate.

Embodiment 3

In this embodiment, a structure of a foldable touch panel that can be used in the electronic device of one embodiment of the present invention will be described with reference to FIGS. 10A to 10C.

Figure 10A:
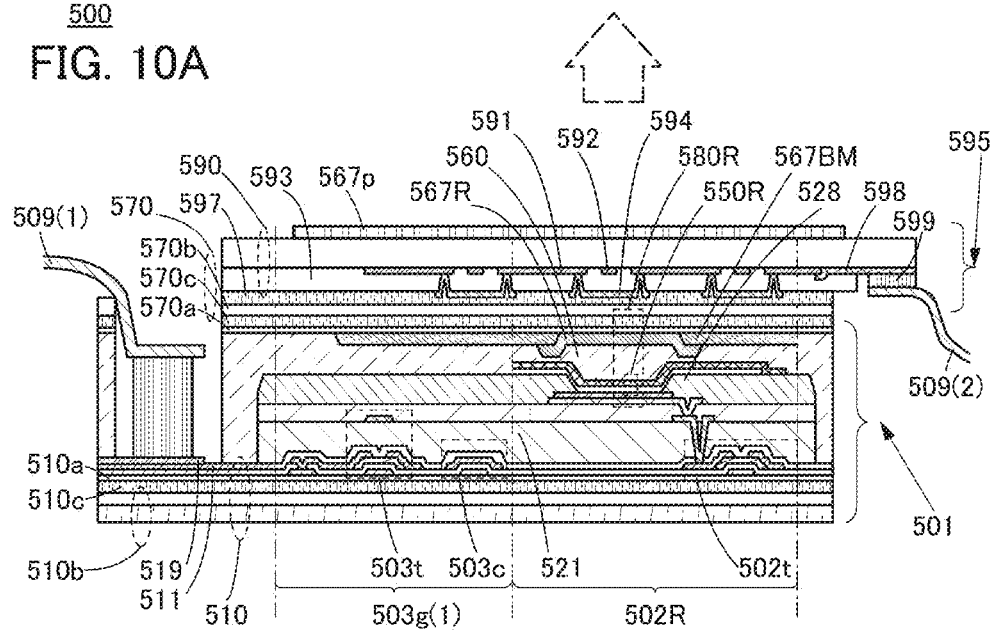
FIGS. 10A to 10C illustrate structure examples of a display panel of an embodiment.
Figure 10B:
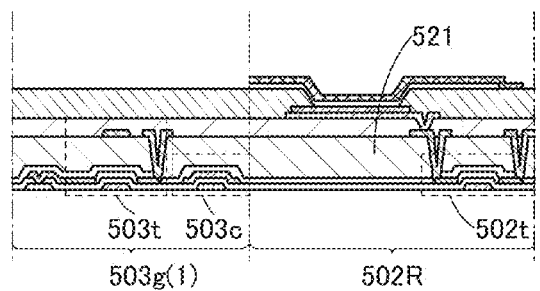
Figure 10C:
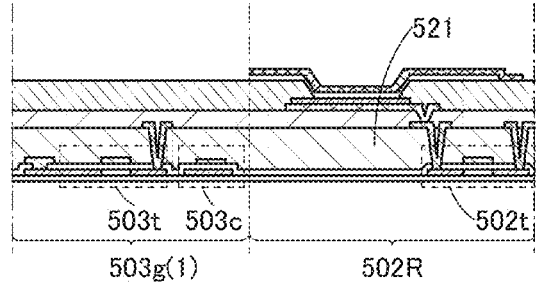

FIGS. 10A to 10C are cross-sectional views of a touch panel 500.

The touch panel 500 includes a display portion 501 and a touch sensor 595. Furthermore, the touch panel 500 includes a substrate 510, a substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals are supplied to the pixels. The plurality of wirings 511 is led to a peripheral portion of the substrate 510, and part of the plurality of wirings 511 forms a terminal 519. The terminal 519 is electrically connected to an FPC 509(1).

<Touch Sensor>

The substrate 590 includes the touch sensor 595 and a plurality of wirings 598 electrically connected to the touch sensor 595. The plurality of wirings 598 is led to a peripheral portion of the substrate 590, and part of the plurality of wirings 598 forms a terminal. The terminal is electrically connected to an FPC 509(2).

As the touch sensor 595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below.

Note that a variety of sensors that can sense the closeness or the contact of a sensing target such as a finger, can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 can be any of a variety of shapes. For example, the plurality of electrodes 591 may be provided so that a space between the electrodes 591 is reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

The touch sensor 595 includes the substrate 590, the electrodes 591 and the electrodes 592 provided in a staggered arrangement on the substrate 590, an insulating layer 593 covering the electrodes 591 and the electrodes 592, and the wiring 594 that electrically connects the adjacent electrodes 591 to each other.

An adhesive layer 597 attaches the substrate 590 to the substrate 570 so that the touch sensor 595 overlaps with the display portion 501.

The electrodes 591 and the electrodes 592 are formed using a light-transmitting conductive material. As the light-transmitting conductive material, a conductive oxide such as indium oxide, indium tin oxide, indium zinc oxide, zinc oxide, or zinc oxide to which gallium is added, or graphene can be used.

The electrodes 591 and the electrodes 592 may be formed by depositing a light-transmitting conductive material on the substrate 590 by a sputtering method and then removing an unnecessary portion by any of various patterning techniques such as photolithography. Graphene may be formed in such a manner that a solution in which graphene oxide is dispersed is applied and reduced, in addition to a CVD method.

Examples of a material for the insulating layer 593 are a resin such as acrylic or epoxy resin, a resin having a siloxane bond, and an inorganic insulating material such as silicon oxide, silicon oxynitride, or aluminum oxide.

Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and 592 can be favorably used because electric resistance can be reduced.

One electrode 592 extends in one direction, and a plurality of electrodes 592 is provided in the form of stripes.

The wiring 594 intersects with the electrode 592.

Adjacent electrodes 591 are provided with one electrode 592 provided therebetween. The wiring 594 electrically connects the adjacent electrodes 591.

Note that the plurality of electrodes 591 is not necessarily arranged in the direction orthogonal to one electrode 592 and may be arranged to intersect with one electrode 592 at an angle of less than 90 degrees.

One wiring 598 is electrically connected to any of the electrodes 591 and 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

Furthermore, a connection layer 599 electrically connects the wiring 598 to the FPC 509(2).

As the connection layer 599, any of anisotropic conductive films (ACF), anisotropic conductive pastes (ACP), and the like can be used.

The adhesive layer 597 has a light-transmitting property. For example, a thermosetting resin or an ultraviolet curable resin can be used; specifically, a resin such as an acrylic resin, an urethane resin, an epoxy resin, or a resin having a siloxane bond can be used.

<Display Portion>

The display portion 501 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such element.

Other than organic electroluminescent elements, any of various display elements such as display elements (electronic ink) that perform display by an electrophoretic method, an electronic liquid powder method, or the like; MEMS shutter display elements; and optical interference type MEMS display elements can be used. A structure suitable for employed display elements can be selected from among a variety of structures of pixel circuits.

The substrate 510 is a stacked body in which a flexible substrate 510b, a barrier film 510a that prevents diffusion of unintentional impurities to light-emitting elements, and an adhesive layer 510c that attaches the barrier film 510a to the substrate 510b are stacked.

The substrate 570 is a stacked body in which a flexible substrate 570b, a barrier film 570a that prevents diffusion of unintentional impurities to the light-emitting elements, and an adhesive layer 570c that attaches the barrier film 570a to the substrate 570b are stacked.

A sealant 560 attaches the substrate 570 to the substrate 510. The sealant 560 has a refractive index higher than that of air. In the case of extracting light to the sealant 560 side, the sealant 560 serves as an optical adhesive layer. The pixel circuits and the light-emitting elements (e.g., a light-emitting element 550R) are provided between the substrate 510 and the substrate 570.

<<Structure of Pixel>>

A pixel includes a sub-pixel 502R, and the sub-pixel 502R includes a light-emitting module 580R.

The sub-pixel 502R includes the light-emitting element 550R and the pixel circuit that can supply electric power to the light-emitting element 550R and includes a transistor 502t. Furthermore, the light-emitting module 580R includes the light-emitting element 550R and an optical element (e.g., a coloring layer 567R).

The light-emitting element 550R includes a lower electrode, an upper electrode, and a layer containing a light-emitting organic compound between the lower electrode and the upper electrode.

The light-emitting module 580R includes the coloring layer 567R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

In the case where the sealant 560 is provided on the light extraction side, the sealant 560 is in contact with the light-emitting element 550R and the coloring layer 567R.

The coloring layer 567R is positioned in a region overlapping with the light-emitting element 550R. Accordingly, part of light emitted from the light-emitting element 550R passes through the coloring layer 567R and is emitted to the outside of the light-emitting module 580R as indicated by an arrow in FIG. 10A.

<<Structure of Display Portion>>

The display portion 501 includes a light-blocking layer 567BM on the light extraction side. The light-blocking layer 567BM is provided so as to surround the coloring layer (e.g., the coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness caused by the pixel circuits. A stacked film including a layer that can prevent diffusion of impurities can be used as the insulating film 521. This can prevent the reliability of the transistor 502t or the like from being lowered by diffusion of unintentional impurities.

The display portion 501 includes the light-emitting elements (e.g., the light-emitting element 550R) over the insulating film 521.

The display portion 501 includes, over the insulating film 521, a partition 528 that overlaps with an end portion of a lower electrode. In addition, a spacer that controls the distance between the substrate 510 and the substrate 570 is provided on the partition 528.

<<Structure of Scan Line Driver Circuit>>

A scan line driver circuit 503g(1) includes a transistor 503t and a capacitor 503c. Note that the driver circuit can be formed in the same process and over the same substrate as those of the pixel circuits.

<<Other Structures>>

The display portion 501 includes the wirings 511 through which signals can be supplied. The wirings 511 are provided with the terminal 519. Note that the FPC 509(1) through which a signal such as an image signal or a synchronization signal can be supplied is electrically connected to the terminal 519.

Note that a printed wiring board (PWB) may be attached to the FPC 509(1).

<Modification Example 1 of Display Portion>

Any of various kinds of transistors can be used in the display portion 501.

A structure in the case of using bottom-gate transistors in the display portion 501 is illustrated in FIGS. 10A and 10B.

For example, a semiconductor layer containing an oxide semiconductor, amorphous silicon, or the like can be used in the transistor 502t and the transistor 503t illustrated in FIG. 10A.

For example, a semiconductor layer containing polycrystalline silicon or the like can be used in the transistor 502t and the transistor 503t illustrated in FIG. 10B.

A structure in the case of using top-gate transistors in the display portion 501 is illustrated in FIG. 10C.

For example, a semiconductor layer containing polycrystalline silicon, a transferred single crystal silicon film, or the like can be used in the transistor 502t and the transistor 503t illustrated in FIG. 10C.

At least part of this embodiment can be implemented in combination with any of the other embodiments described in this specification as appropriate.

Embodiment 4

In this embodiment, a structure of a foldable touch panel that can be used in the electronic device of one embodiment of the present invention will be described with reference to FIGS. 11A to 11C.

Figure 11A:
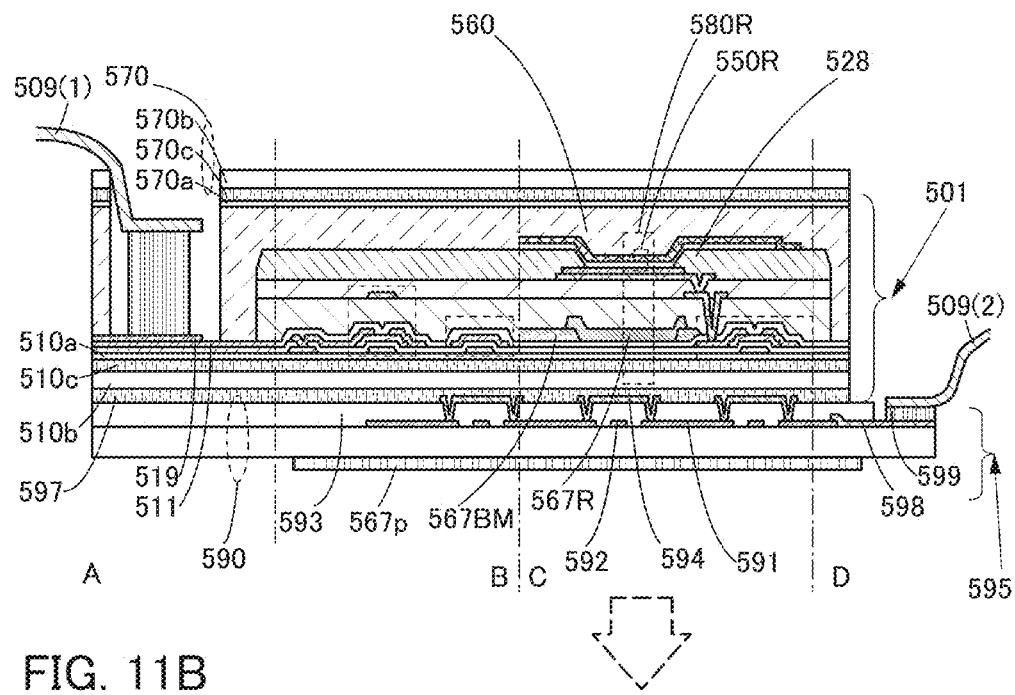
FIGS. 11A to 11C illustrate structure examples of a display panel of an embodiment.
Figure 11B:
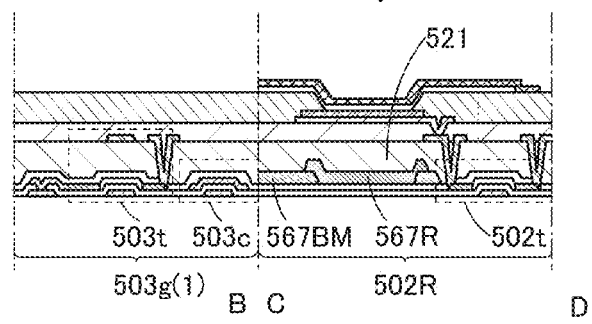
Figure 11C:
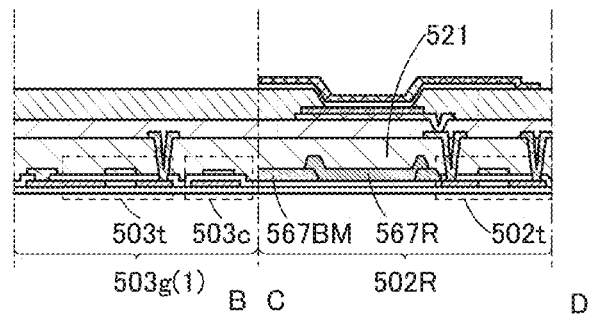

FIGS. 11A to 11C are cross-sectional views of a touch panel 500B.

The touch panel 500B described in this embodiment is different from the touch panel 500 described in Embodiment 3 in that the display portion 501 displays received image data to the side where the transistors are provided and that the touch sensor is provided on the substrate 510 side of the display portion. Different structures will be described in detail below, and the above description is referred to for the other similar structures.

<Display Portion>

The display portion 501 includes a plurality of pixels arranged in a matrix. Each of the pixels includes a display element and a pixel circuit for driving the display element.

<<Structure of Pixel>>

A pixel includes the sub-pixel 502R, and the sub-pixel 502R includes a light-emitting module 580R.

The sub-pixel 502R includes the light-emitting element 550R and the pixel circuit that can supply electric power to the light-emitting element 550R and includes the transistor 502t.

The light-emitting module 580R includes the light-emitting element 550R and an optical element (e.g., the coloring layer 567R).

The light-emitting element 550R includes a lower electrode, an upper electrode, and a layer containing a light-emitting organic compound between the lower electrode and the upper electrode.

The light-emitting module 580R includes the coloring layer 567R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

The coloring layer 567R is positioned in a region overlapping with the light-emitting element 550R. The light-emitting element 550R illustrated in FIG. 11A emits light to the side where the transistor 502t is provided. Accordingly, part of light emitted from the light-emitting element 550R passes through the coloring layer 567R and is emitted to the outside of the light-emitting module 580R as indicated by an arrow in FIG. 11A.

<<Structure of Display Portion>>

The display portion 501 includes a light-blocking layer 567BM on the light extraction side. The light-blocking layer 567BM is provided so as to surround the coloring layer (e.g., the coloring layer 567R).

The display portion 501 includes an insulating film 521. The insulating film 521 covers the transistor 502t. Note that the insulating film 521 can be used as a layer for planarizing unevenness caused by the pixel circuits. A stacked film including a layer that can prevent diffusion of impurities can be used as the insulating film 521. This can prevent the reliability of the transistor 502t or the like from being lowered by diffusion of unintentional impurities from the coloring layer 567R.

<Touch Sensor>

The touch sensor 595 is provided on the substrate 510 side of the display portion 501 (see FIG. 11A).

The adhesive layer 597 is provided between the substrate 510 and the substrate 590 and attaches the touch sensor 595 to the display portion 501.

<Modification Example 1 of Display Portion>

Any of various kinds of transistors can be used in the display portion 501.

A structure in the case of using bottom-gate transistors in the display portion 501 is illustrated in FIGS. 11A and 11B.

For example, a semiconductor layer containing an oxide semiconductor, amorphous silicon, or the like can be used in the transistor 502t and the transistor 503t illustrated in FIG. 11A.

For example, a semiconductor layer containing polycrystalline silicon or the like can be used in the transistor 502t and the transistor 503t illustrated in FIG. 11B.

A structure in the case of using top-gate transistors in the display portion 501 is illustrated in FIG. 11C.

For example, a semiconductor layer containing polycrystalline silicon, a transferred single crystal silicon film, or the like can be used in the transistor 502t and the transistor 503t illustrated in FIG. 11C.

At least part of this embodiment can be implemented in combination with any of the other embodiments described in this specification as appropriate.

Embodiment 5

An oxide semiconductor suitable for a semiconductor layer of a semiconductor device that can be used for a display panel of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (e.g., cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

Note that if the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier concentration thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, further preferably less than or equal to $1\times10^{-24}$ A; or at 85° C., less than or equal to $1\times10^{-15}$ A, preferably less than or equal to $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1 V or more, 2 V or more, or 3 V or more.

A structure of the oxide semiconductor film is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 12A:
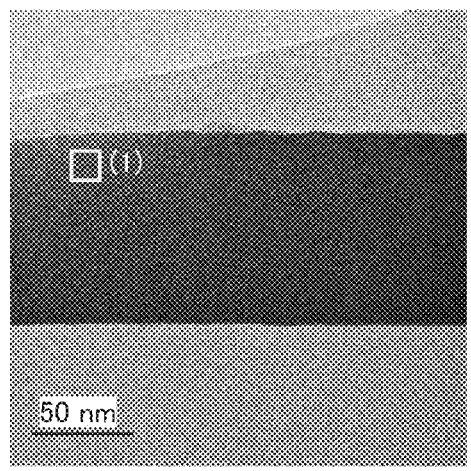
FIGS. 12A to 12D are Cs-corrected high-resolution TEM images of a cross section of a CAAC-OS and a cross-sectional schematic view of the CAAC-OS.

A CAAC-OS observed with TEM is described below. FIG. 12A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 12B:
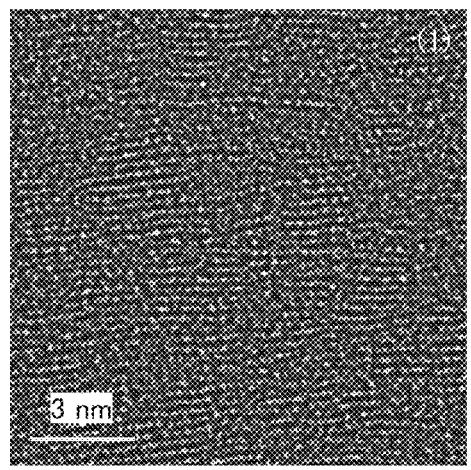

FIG. 12B is an enlarged Cs-corrected high-resolution TEM image of a region (1) in FIG. 12A. FIG. 12B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 12C:
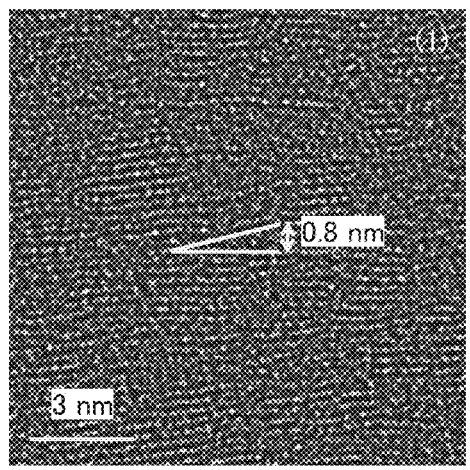

As shown in FIG. 12B, the CAAC-OS has a characteristic atomic arrangement. The characteristic atomic arrangement is denoted by an auxiliary line in FIG. 12C. FIGS. 12B and 12C prove that the size of a pellet is approximately 1 nm to 3 nm, and the size of a space caused by tilt of the pellets is approximately 0.8 nm. Therefore, the pellet can also be referred to as a nanocrystal (nc).

Figure 12D:
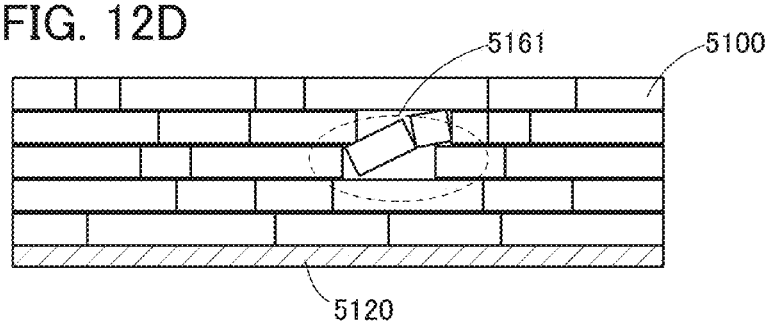

Here, according to the Cs-corrected high-resolution TEM images, the schematic arrangement of pellets 5100 of a CAAC-OS over a substrate 5120 is illustrated by such a structure in which bricks or blocks are stacked (see FIG. 12D). The part in which the pellets are tilted as observed in FIG. 12C corresponds to a region 5161 shown in FIG. 12D.

Figure 13A:
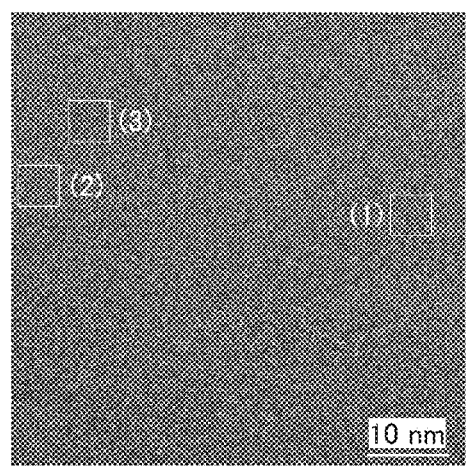
FIGS. 13A to 13D are Cs-corrected high-resolution TEM images of a plane of a CAAC-OS.
Figure 13B:
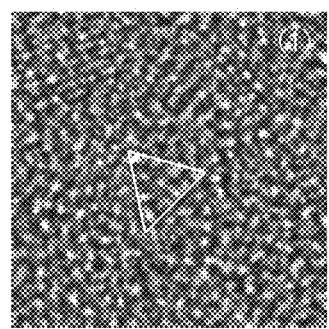
Figure 13C:
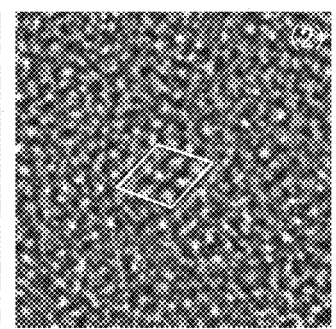
Figure 13D:
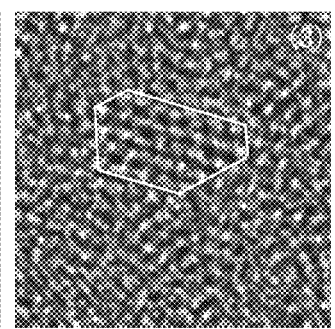

FIG. 13A shows a Cs-corrected high-resolution TEM image of a plane of the CAAC-OS observed from a direction substantially perpendicular to the sample surface. FIGS. 13B, 13C, and 13D are enlarged Cs-corrected high-resolution TEM images of regions (1), (2), and (3) in FIG. 13A, respectively. FIGS. 13B, 13C, and 13D indicate that metal atoms are arranged in a triangular, quadrangular, or hexagonal configuration in a pellet. However, there is no regularity of arrangement of metal atoms between different pellets.

Figure 14A:
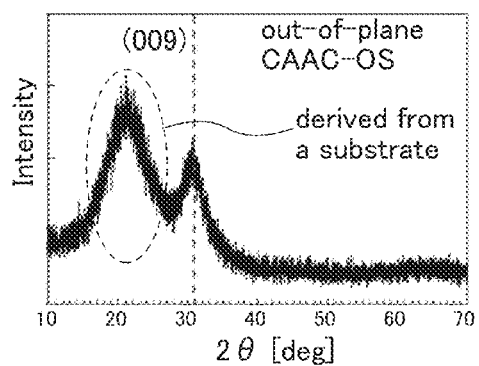
FIGS. 14A to 14C show structure analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 14A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 14B:
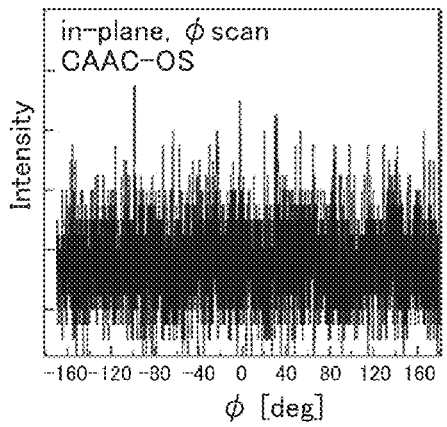
Figure 14C:
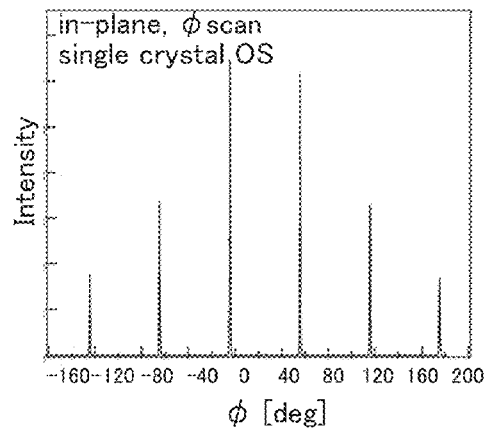

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 14B, a peak is not clearly observed. In contrast, in the case of a single crystal oxide semiconductor of InGaZnO$_4$, when φ scan is performed with 2θ fixed at around 56°, as shown in FIG. 14C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 15A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 15B shows a diffraction pattern obtained in such a manner that an electron beam with a probe diameter of 300 nm is incident on the same sample in a direction perpendicular to the sample surface. As shown in FIG. 15B, a ring-like diffraction pattern is observed. Thus, the electron diffraction also indicates that the a-axes and b-axes of the pellets included in the CAAC-OS do not have regular alignment. The first ring in FIG. 15B is considered to be derived from the (010) plane, the (100) plane, and the like of the InGaZnO$_4$ crystal. The second ring in FIG. 15B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 16:
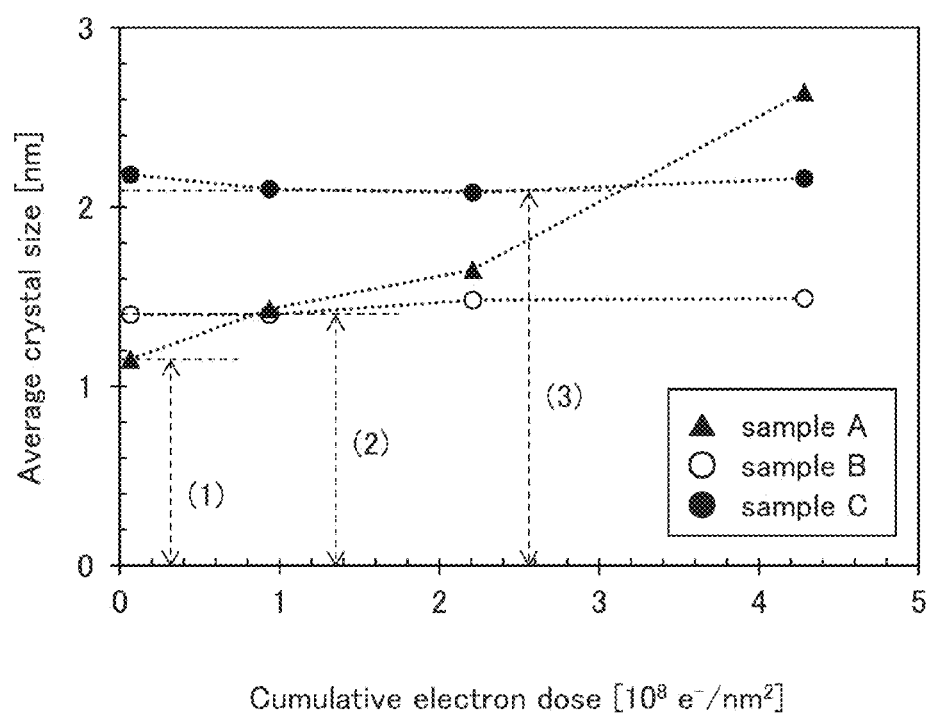
FIG. 16 shows a change of crystal parts of an In—Ga—Zn oxide owing to electron irradiation.

FIG. 16 shows change in the average size of crystal parts (at 22 points to 45 points) in each sample. Note that the crystal part size corresponds to the length of a lattice fringe. FIG. 16 indicates that the crystal part size in the a-like OS increases with an increase in the cumulative electron dose. Specifically, as shown by (1) in FIG. 16, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 16, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

The CAAC-OS film is formed, for example, by the following method.

For example, the CAAC-OS film is formed by a sputtering method with a polycrystalline oxide semiconductor sputtering target.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like or pellet-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower.

The heat treatment under the reduced pressure can reduce the concentration of impurities in the first oxide semiconductor film for a shorter time.

The first oxide semiconductor film with a thickness greater than or equal to 1 nm and less than 10 nm can be easily crystallized by heat treatment as compared to the case where the first oxide semiconductor film has a thickness greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

In the above-described manner, a CAAC-OS film with a total thickness of greater than or equal to 10 nm can be formed.

At least part of this embodiment can be implemented in combination with any of the other embodiments described in this specification as appropriate.

EXPLANATION OF REFERENCE

101: housing, 102: substrate, 103: FPC, 103*a*: FPC, 104: IC, 105: touch sensor, 106: FPC, 110: display panel, 111: display region, 112: display region, 113: display region, 114: display region, 115: display region, 121: icon, 122: text data, 123: icon, 124: text data, 125: slide bar, 126: finger, 131: side, 132: side, 133: side, 138: notch portion, 141: driver circuit, 142: driver circuit, 143: driver circuit, 145: wiring, 146: wiring, 300: touch panel, 301: display portion, 302: pixel, 302B: sub-pixel, 302G: sub-pixel, 302R: sub-pixel, 302*t*: transistor, 303*c*: capacitor, 303*g*(1): scan line driver circuit, 303*g*(2): imaging pixel driver circuit, 303*s*(1): image signal line driver circuit, 303*s*(2): imaging signal line driver circuit, 303*t*: transistor, 308: imaging pixel, 308*p*: photoelectric conversion element, 308*t*: transistor, 309: FPC, 310: substrate, 310*a*: barrier film, 310*b*: substrate, 310*c*: adhesive layer, 311: wiring, 319: terminal, 321: insulating film, 328: partition, 329: spacer, 350R: light-emitting element, 351R: lower electrode, 352: upper electrode, 353: layer, 353*a*: light-emitting unit, 353*b*: light-emitting unit, 354: intermediate layer, 360: sealant, 367BM: light-blocking layer, 367*p*: anti-reflective layer, 367R: coloring layer, 370: counter substrate, 370*a*: barrier film, 370*b*: substrate, 370*c*: adhesive layer, 380B: light-emitting module, 380G: light-emitting module, 380R: light-emitting module, 500: touch panel, 500B: touch panel, 501: display portion, 502R: sub-pixel, 502*t*: transistor, 503*c*: capacitor, 503*g*(1): scan line driver circuit, 503*t*: transistor, 509: FPC, 510: substrate, 510*a*: barrier film, 510*b*: substrate, 510*c*: adhesive layer, 511: wiring, 519: terminal, 521: insulating film, 528: partition, 550R: light-emitting element, 560: sealant, 567BM: light-blocking layer, 567*p*: anti-reflective layer, 567R: coloring layer, 570: substrate, 570*a*: barrier film, 570*b*: substrate, 570*c*: adhesive layer, 580R: light-emitting module, 590: substrate, 591: electrode, 592: electrode, 593: insulating layer, 594: wiring, 595: touch sensor, 597: adhesive layer, 598: wiring, 599: connection layer, 5100: pellet, 5120: substrate, and 5161: region.

This application is based on Japanese Patent Application serial no. 2013-236969 filed with Japan Patent Office on Nov. 15, 2013, and Japanese Patent Application serial no. 2013-236966 filed with Japan Patent Office on Nov. 15, 2013, the entire contents of which are hereby incorporated by reference.

What is claimed is:
1. An electronic device comprising:
a housing;
a display panel;
a touch sensor;
a first flexible printed circuit; and
a second flexible printed circuit,
wherein the housing comprises a top surface, a first side surface, a second side surface opposite to the first side surface,
wherein the display panel comprises a first display region overlapping with the top surface, a second display region overlapping with the first side surface, and a third display region overlapping with the second side surface,
wherein the touch sensor comprises a first region overlapping with the first display region, a second region overlapping with the second display region, and a third region overlapping with the third display region,
wherein the each of the first side surface, the second display region, and the second region comprises a curved surface,
wherein the each of the second side surface, the third display region, and the third region comprises a curved surface,
wherein the first flexible printed circuit is electrically connected to the display panel,
wherein the first flexible printed circuit overlaps with the first display region and is located in a rear side of the display panel,
wherein the second flexible printed circuit is electrically connected to the touch sensor, and
wherein the second flexible printed circuit overlaps with the first display region and is located in the rear side of the display panel.
2. The electronic device according to claim 1, wherein the first flexible printed circuit does not overlap with the second flexible printed circuit.

3. The electronic device according to claim 1, wherein the second display region is configured to display independent from the first display region.

4. The electronic device according to claim 1, wherein the second display region is configured to display a plurality of icons.

5. The electronic device according to claim 1, wherein the second display region is configured to display transmitter information when a phone call or an e-mail is received.

6. An electronic device comprising:
a housing;
a display panel;
a touch sensor;
a first flexible printed circuit; and
a second flexible printed circuit,
wherein the housing comprises a top surface, a first side surface, a second side surface opposite to the first side surface,
wherein the display panel comprises a first display region overlapping with the top surface, a second display region overlapping with the first side surface, and a third display region overlapping with the second side surface,
wherein the touch sensor comprises a first region overlapping with the first display region, a second region overlapping with the second display region, and a third region overlapping with the third display region,
wherein the each of the first side surface, the second display region, and the second region comprises a curved surface,
wherein the each of the second side surface, the third display region, and the third region comprises a curved surface,
wherein the first flexible printed circuit is electrically connected to the display panel,
wherein the first flexible printed circuit overlaps with the first display region and is located in a rear side of the display panel,
wherein the second flexible printed circuit is electrically connected to the touch sensor,
wherein the second flexible printed circuit overlaps with the first display region and is located in the rear side of the display panel, and
wherein the second flexible printed circuit is located in a concave space formed in a rear side of the touch sensor by the first region, the second region, and the third region.

7. The electronic device according to claim 6, wherein the first flexible printed circuit does not overlap with the second flexible printed circuit.

8. The electronic device according to claim 6, wherein the second display region is configured to display independent from the first display region.

9. The electronic device according to claim 6, wherein the second display region is configured to display a plurality of icons.

10. The electronic device according to claim 6, wherein the second display region is configured to display transmitter information when a phone call or an e-mail is received.

11. An electronic device comprising:
a housing;
a display panel;
a touch sensor;
a first flexible printed circuit; and
a second flexible printed circuit,
wherein the housing comprises a top surface, a first side surface, a second side surface opposite to the first side surface,
wherein the display panel comprises a first display region overlapping with the top surface, a second display region overlapping with the first side surface, and a third display region overlapping with the second side surface,
wherein the touch sensor comprises a first region overlapping with the first display region, a second region overlapping with the second display region, and a third region overlapping with the third display region,
wherein the each of the first side surface, the second display region, and the second region comprises a curved surface,
wherein the each of the second side surface, the third display region, and the third region comprises a curved surface,
wherein the first flexible printed circuit is electrically connected to the display panel,
wherein the first flexible printed circuit overlaps with the first display region and is located in a rear side of the display panel,
wherein the second flexible printed circuit is electrically connected to the touch sensor,
wherein the second flexible printed circuit overlaps with the first display region and is located in the rear side of the display panel,
wherein the second flexible printed circuit is located in a concave space formed in a rear side of the touch sensor by the first region, the second region, and the third region,
wherein the display panel comprises:
an adhesive layer;
a semiconductor layer in which channel is formed, the semiconductor layer is located over the adhesive layer;
a first conductive film electrically connected to the semiconductor layer;
a second conductive film electrically connected to the semiconductor layer;
an insulating film over the semiconductor layer, the first conductive film, and the second conductive film;
a first electrode over the insulating film, the first electrode being electrically connected to one of the first conductive film and the second conductive film;
a layer comprising a light-emitting organic compound, the layer is located over the first electrode; and
a second electrode over the layer,
wherein a terminal of the display panel comprises a first wiring and a second wiring over the first wiring,
wherein the first wiring and one of the first conductive film and the second conductive film comprise a same conductive material,
wherein the second wiring and the first electrode comprise a same conductive material, and
wherein the first flexible printed circuit is electrically connected to the terminal.

12. The electronic device according to claim 11, wherein the display panel comprises a substrate, and
wherein the adhesive layer and the first wiring are located over the substrate.

13. The electronic device according to claim 11, wherein the first flexible printed circuit does not overlap with the second flexible printed circuit.

14. The electronic device according to claim 11, wherein the second display region is configured to display independent from the first display region.

15. The electronic device according to claim 11, wherein the second display region is configured to display a plurality of icons.

16. The electronic device according to claim 11, wherein the second display region is configured to display transmitter information when a phone call or an e-mail is received.

17. An electronic device comprising:
- a display panel comprising a display region and a first curved display region adjacent to the display region;
- a touch sensor overlapping with the display panel; and
- a flexible printed circuit electrically connected to the touch sensor,
- wherein the touch sensor comprises a region corresponding to the display region, and a first curved region corresponding to the first curved display region, and
- wherein the flexible printed circuit overlaps with the display region and is located in a rear side of the display panel.

18. The electronic device according to claim 17,
- wherein the display panel comprises a second curved display region adjacent to the display region, the display region being located between the first curved display region and the second curved display region,
- wherein the touch sensor comprises a second curved region corresponding to the second curved display region, and
- wherein the flexible printed circuit is located in a concave space formed in a rear side of the touch sensor by the region, the first curved region, and the second curved region.

19. The electronic device according to claim 17, wherein the first curved display region is configured to display independent from the display region.

20. The electronic device according to claim 17, wherein the first curved display region is configured to display a plurality of icons.

21. The electronic device according to claim 17, wherein the first curved display region is configured to display transmitter information when a phone call or an e-mail is received.

\* \* \* \* \*